(12) United States Patent
Yamamoto et al.

(10) Patent No.: US 11,784,459 B2
(45) Date of Patent: Oct. 10, 2023

(54) ELECTRICAL ELEMENT MOUNTING PACKAGE, ARRAY PACKAGE, AND ELECTRICAL DEVICE

(71) Applicant: KYOCERA Corporation, Kyoto (JP)

(72) Inventors: Sentarou Yamamoto, Kagoshima (JP); Youji Furukubo, Kirishima (JP); Masanori Okamoto, Kirishima (JP); Toshifumi Higashi, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/539,882

(22) Filed: Dec. 1, 2021

(65) Prior Publication Data
US 2022/0094135 A1    Mar. 24, 2022

Related U.S. Application Data

(63) Continuation of application No. 16/323,803, filed as application No. PCT/JP2017/028988 on Aug. 9, 2017, now abandoned.

(30) Foreign Application Priority Data

Aug. 10, 2016 (JP) ................................. 2016-157221
Nov. 11, 2016 (JP) ................................. 2016-221034

(51) Int. Cl.
*H01S 5/02315*    (2021.01)
*H01L 23/13*    (2006.01)
(Continued)

(52) U.S. Cl.
CPC .......... *H01S 5/02315* (2021.01); *H01L 23/12* (2013.01); *H01L 23/13* (2013.01);
(Continued)

(58) Field of Classification Search
CPC .... H01S 5/02236; H01S 5/022; H01S 5/4093; H01S 5/02469; H01S 5/02276;
(Continued)

(56) References Cited

U.S. PATENT DOCUMENTS

| | | | |
|---|---|---|---|
| 5,315,486 A | 5/1994 | Fillion et al. | |
| 6,404,042 B1* | 6/2002 | Sone | H01S 5/02216 |
| | | | 257/706 |
| 2001/0013756 A1* | 8/2001 | Mori | H01L 51/524 |
| | | | 313/506 |

(Continued)

FOREIGN PATENT DOCUMENTS

| | | |
|---|---|---|
| JP | 61-199052 U | 12/1986 |
| JP | 05-243481 A | 9/1993 |

(Continued)

*Primary Examiner* — Xinning(Tom) Niu
(74) *Attorney, Agent, or Firm* — Volpe Koenig

(57) ABSTRACT

A light emitting element mounting package includes a plate-like substrate and a base that protrudes from a front surface of the substrate and has a mounting surface on which a light emitting element is mounted. A power supply terminal is provided on the front surface of the substrate, and the power supply terminal is arranged in a direction that is opposite to a direction where an emitting surface of the light emitting element is oriented. The light emitting element mounting package further includes a wiring conductor inside the substrate, wherein the wiring conductor extends to a side of the power supply terminal where one end thereof is positioned at a side of the power supply terminal with respect to the emitting surface of the light emitting element and the other end thereof is electrically connected to the power supply terminal.

13 Claims, 22 Drawing Sheets

(51) Int. Cl.

| | | |
|---|---|---|
| *H01S 5/022* | (2021.01) | |
| *H01L 23/12* | (2006.01) | |
| *H01L 23/36* | (2006.01) | |
| *H01S 5/023* | (2021.01) | |
| *H01S 5/0233* | (2021.01) | |
| *H01S 5/0235* | (2021.01) | |
| *H01L 23/15* | (2006.01) | |
| *H01L 23/498* | (2006.01) | |
| *H01S 5/024* | (2006.01) | |
| *H01S 5/40* | (2006.01) | |
| *H01S 5/02345* | (2021.01) | |

(52) U.S. Cl.
CPC .............. *H01L 23/15* (2013.01); *H01L 23/36* (2013.01); *H01L 23/49827* (2013.01); *H01L 23/49838* (2013.01); *H01S 5/022* (2013.01); *H01S 5/023* (2021.01); *H01S 5/0233* (2021.01); *H01S 5/0235* (2021.01); *H01S 5/02469* (2013.01); *H01S 5/4093* (2013.01); *H01L 2224/48091* (2013.01); *H01L 2924/15192* (2013.01); *H01S 5/02345* (2021.01)

(58) Field of Classification Search
CPC .............. H01L 23/36; H01L 23/12; H01L 23/49838; H01L 23/49827; H01L 23/15; H01L 23/13; H01L 2224/48091; H01L 2924/15192; H01L 25/0652; H01L 24/06; H01L 23/525; H01L 23/481; H01L 23/29
See application file for complete search history.

(56) References Cited

U.S. PATENT DOCUMENTS

| | | | |
|---|---|---|---|
| 2004/0202212 A1* | 10/2004 | Yamauchi | G11B 7/123 |
| 2005/0133808 A1 | 6/2005 | Uraya et al. | |
| 2006/0219924 A1 | 10/2006 | Lee et al. | |
| 2007/0241447 A1 | 10/2007 | Cheung et al. | |
| 2007/0284597 A1* | 12/2007 | Nawashiro | H01L 33/486 |
| | | | 257/89 |
| 2009/0014752 A1 | 1/2009 | Ueda et al. | |
| 2009/0296367 A1 | 12/2009 | Sekine et al. | |
| 2010/0020469 A1 | 1/2010 | Kurioka et al. | |
| 2010/0284433 A1* | 11/2010 | Hata | H04N 9/3105 |
| | | | 977/755 |
| 2012/0061692 A1* | 3/2012 | Chang | H01L 33/08 |
| | | | 257/E27.12 |
| 2012/0275747 A1 | 11/2012 | Kimura | |
| 2014/0241388 A1 | 8/2014 | Yamanaka et al. | |
| 2017/0051884 A1* | 2/2017 | Raring | H01S 5/023 |
| 2018/0208820 A1 | 7/2018 | Tsuda et al. | |

FOREIGN PATENT DOCUMENTS

| | | |
|---|---|---|
| JP | 09-237854 A | 9/1997 |
| JP | 2002-246523 A | 8/2002 |
| JP | 2003-008072 A | 1/2003 |
| JP | 2003-163382 A | 6/2003 |
| JP | 2005-317592 A | 11/2005 |
| JP | 2005-340543 A | 12/2005 |
| JP | 2007-273603 A | 10/2007 |
| JP | 2007-287916 A | 11/2007 |
| JP | 2007-329374 A | 12/2007 |
| JP | 2008-015434 A | 1/2008 |
| JP | 2009-099633 A | 5/2009 |
| JP | 2009-135543 A | 6/2009 |
| JP | 4511238 B2 | 7/2010 |
| JP | 2012-089728 A | 5/2012 |
| JP | 2014-116514 A | 6/2014 |
| TW | I245436 B | 12/2005 |
| TW | I311803 B | 7/2009 |

* cited by examiner

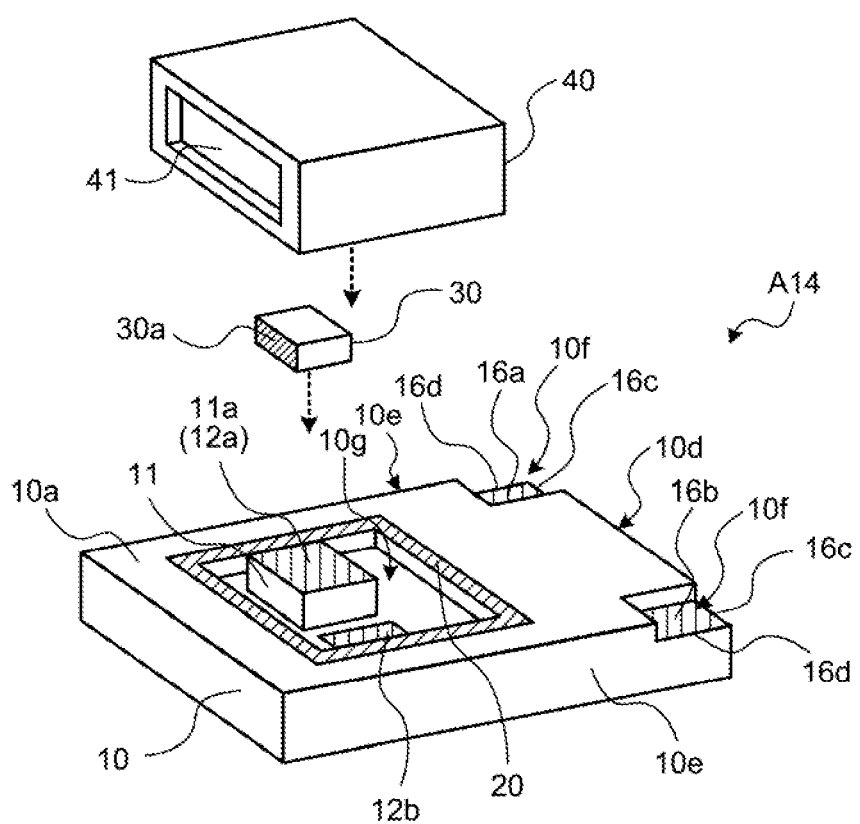

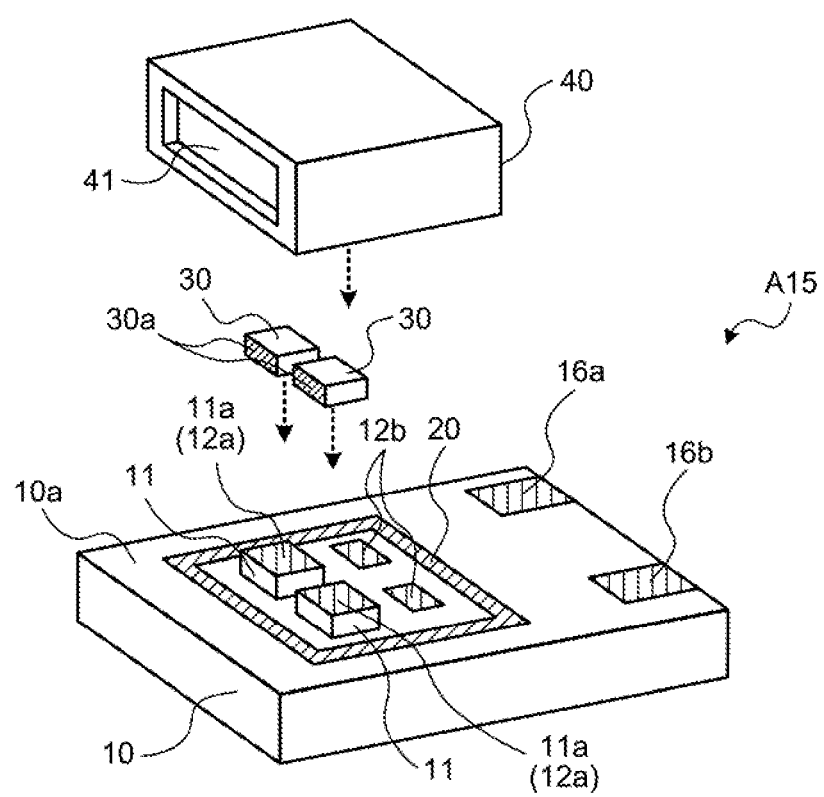

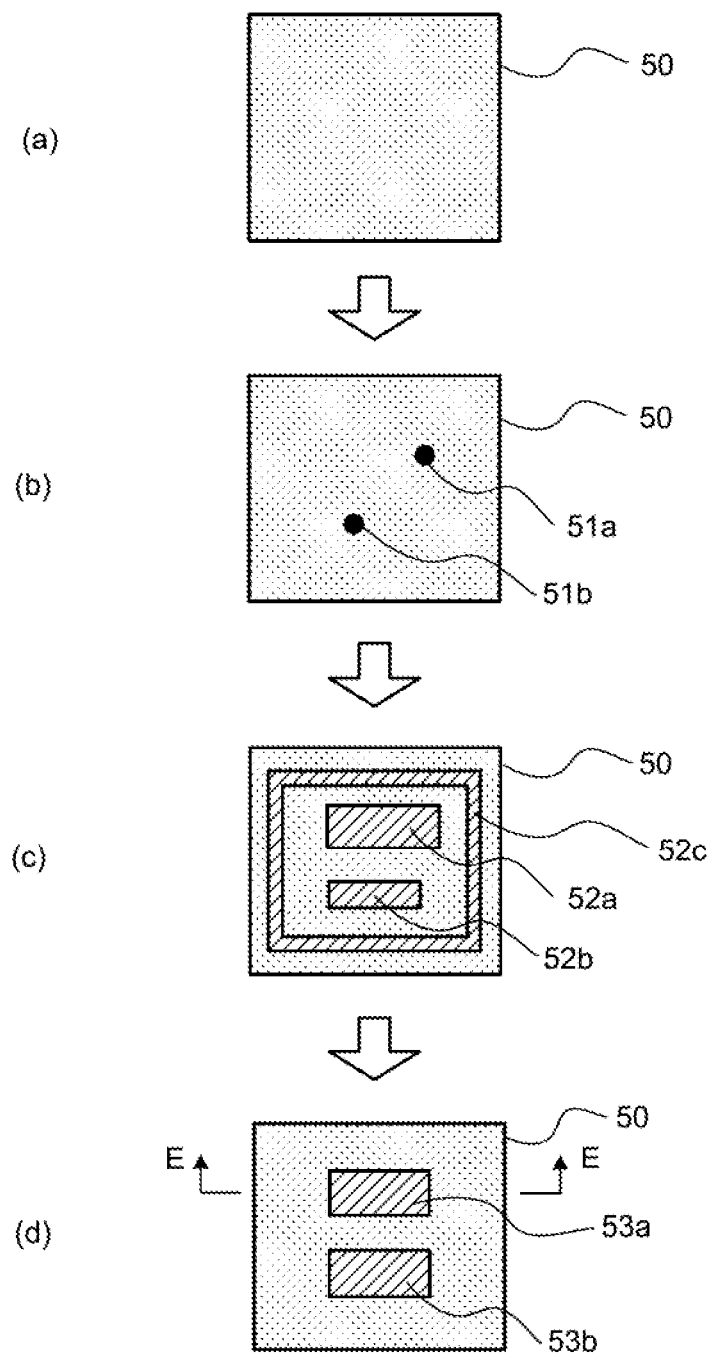

FIG.9
(a)
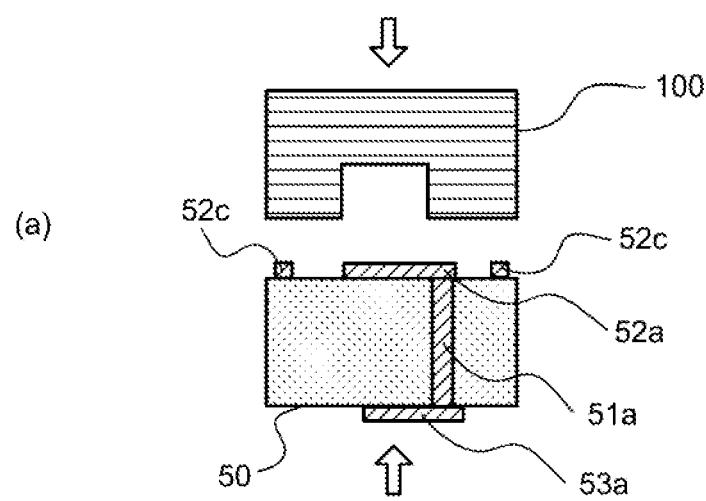
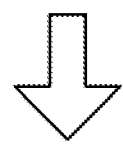
(b)
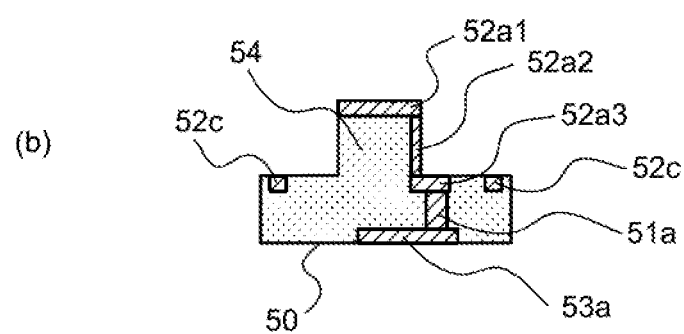

FIG.13
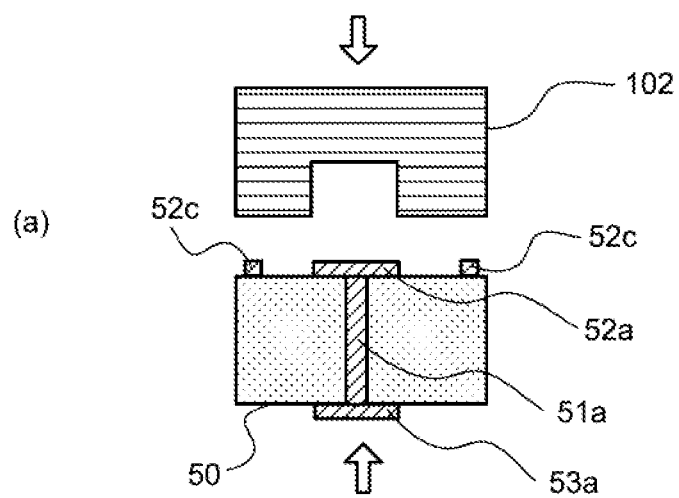
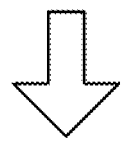
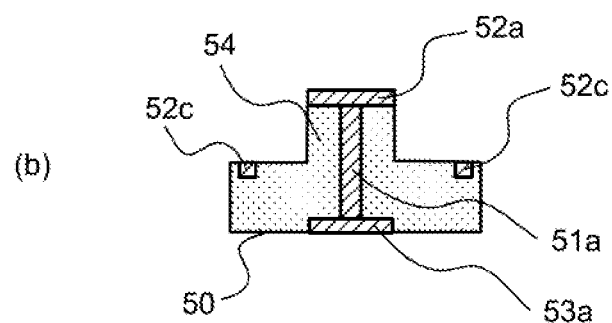

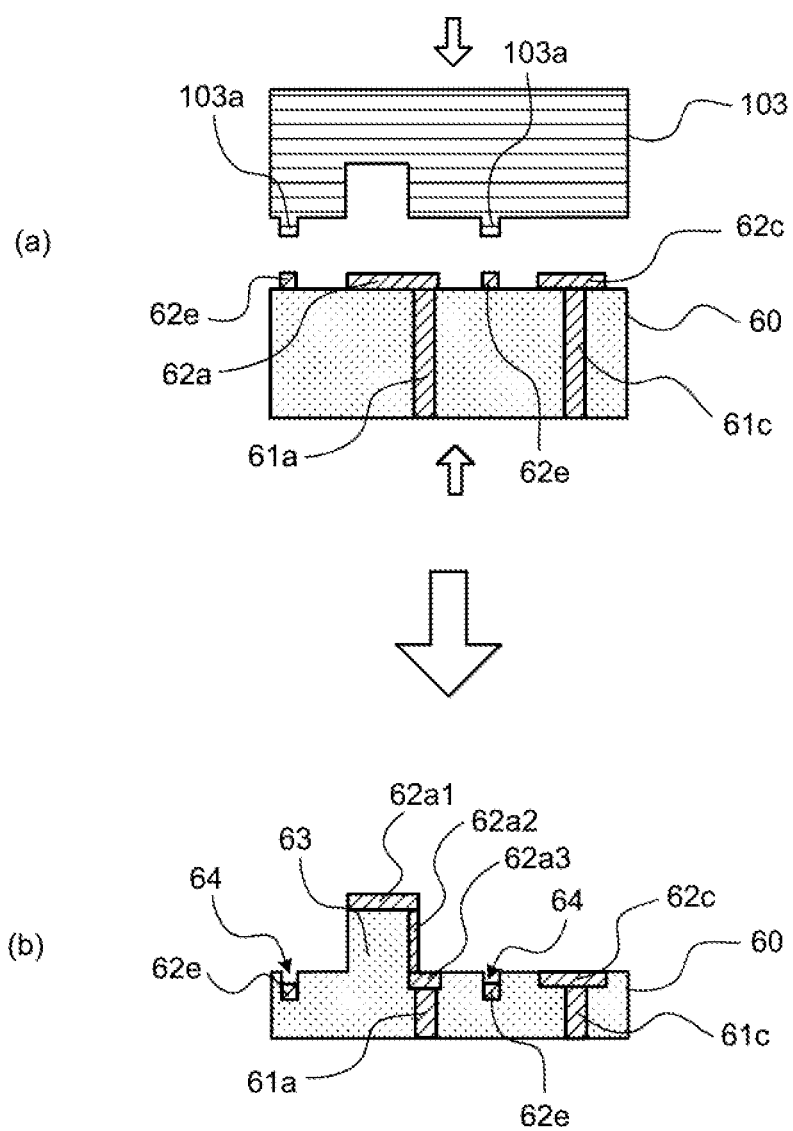

ELECTRICAL ELEMENT MOUNTING PACKAGE, ARRAY PACKAGE, AND ELECTRICAL DEVICE

This application is a Continuation of U.S. patent application Ser. No. 16/323,803, filed on Feb. 7, 2019, which is a 371 International Patent Application of PCT/US2017/028988 filed on Aug. 8, 2017 which claims priority to Japanese Patent applications JP 2016-157221, filed on Aug. 10, 2016 and JP 2016-221034, filed on Nov. 11, 2016, the disclosures of which are incorporated herein in their entireties.

FIELD

The disclosed embodiments relate to an electrical element mounting package, an array package, and an electrical device.

BACKGROUND

Conventionally, a package that includes a metal base for discharging heat to the outside and a sub mount that is made of ceramics and is fixed to the metal base with a joint material, such as solder, has been known as an electrical element mounting package for mounting an electrical element (see, for example, Patent Literature 1).

CITATION LIST

Patent Literature

Patent Literature 1: Japanese Patent Application Publication No. 2014-116514

SUMMARY

Solution to Problem

An electrical element mounting package according to one aspect of embodiments includes a substrate that is plate-like, and at least one base that protrudes from a front surface of the substrate, and that has a mounting surface on which an electrical element is mounted, wherein the substrate and the at least one base are made of ceramics integrally.

Furthermore, an array package according to one aspect of embodiments includes a plurality of the electrical element mounting packages, wherein the plurality of electrical element mounting packages are connected.

Furthermore, an electrical device according to one aspect of embodiments includes the electrical element mounting package, and an electrical element that is mounted on the mounting surface of the electrical element mounting package.

Advantageous Effects of Invention

According to one aspect of embodiments, it is possible to provide an electrical element mounting package, an array package, and an electrical device with high heat dissipation performance.

BRIEF DESCRIPTION OF DRAWINGS

FIG. 5G is a perspective view of an electrical element mounting package according to a twelfth variation of the embodiments.

FIG. 6A is a perspective view of an electrical element mounting package according to a thirteenth variation of the embodiments.

FIG. 8 is a plan view illustrating one manufacturing process of the electrical element mounting package according to the first embodiment.

FIG. 9 is a cross-sectional view illustrating another manufacturing process of the electrical element mounting package according to the first embodiment.

FIG. 13 is a cross-sectional view illustrating one manufacturing process of the electrical element mounting package according to the first variation of the embodiments.

FIG. 14 is a cross-sectional view illustrating one manufacturing process of the electrical element mounting package according to the third variation of the embodiments.

DESCRIPTION OF EMBODIMENTS

A conventional electrical element mounting package has low heat dissipation performance of dissipating heat that is generated by an electrical element to the outside. This is because both of thermal resistance at the interface between a sub mount and a joint material and thermal resistance at the interface between the joint material and a metal base are large, and heat is not effectively transferred from the sub mount to the metal base.

Some modes of embodiments have been conceived in view of the foregoing situations, and an object is to provide an electrical element mounting package, an array package, and an electrical device with high heat dissipation performance.

Embodiments of an electrical element mounting package, an array package, and an electrical device disclosed in the present application will be described below with reference to the accompanying drawings. In the following, modes in which a light emitting element is adopted as an electrical element will be described as examples of the electrical element mounting package, the array package, and the electrical device (hereinafter, referred to as a light emitting element mounting package and a light emitting device); however, the present invention is not limited to the light emitting element, but is, of course, applicable to general electrical elements that have heat generation property.

Examples of the electrical element that have heat generation property include a large scale integrated circuit (LSI), a charge coupled device (CCD), a laser diode, and a light emitting diode (LED). Each of the embodiments described below is particularly useful for a laser diode.

First Embodiment

First of all, an outline of a light emitting element mounting package A1 according to a first embodiment will be described with reference to FIG. 1A and FIG. 1B.

Figure 1A:
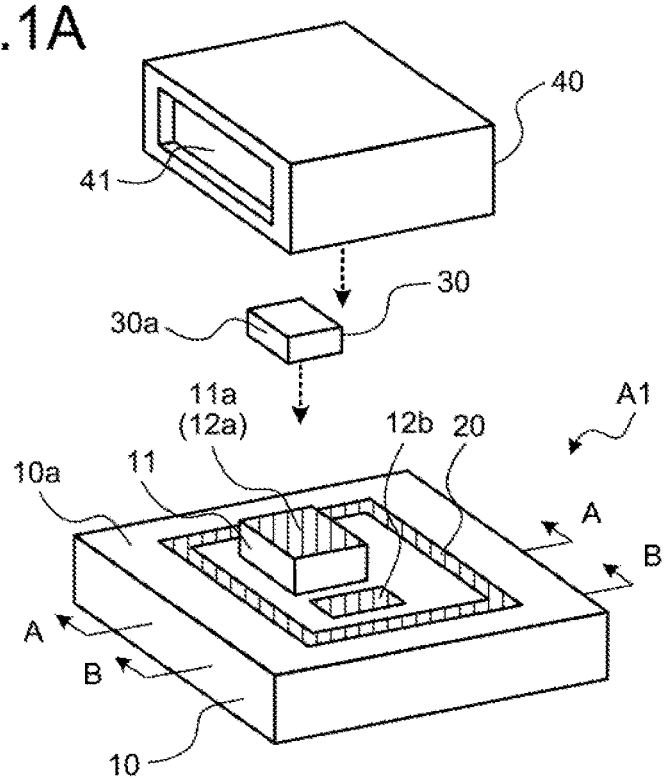
FIG. 1A is a perspective view of an electrical element mounting package according to a first embodiment.

As illustrated in FIG. 1A, etc., the light emitting element mounting package A1 according to the first embodiment includes a plate-like substrate 10 and a base 11 that protrudes upward from a front surface 10a of the substrate 10. In addition, a mounting surface 11a is provided on an upper surface of the base 11, and a light emitting element 30 is mounted on the mounting surface 11a.

Herein, the substrate 10 and the base 11 of the light emitting element mounting package A1 according to the embodiments are made of ceramics integrally. In other words, in the light emitting element mounting package A1, an interface that is made of different kinds of materials and causes large thermal resistance is not provided between the base 11 that is mounted with the light emitting element and the substrate 10 that has a function to discharge heat to the outside.

Thereby, it is possible to reduce the thermal resistance between the substrate and the base 11, so that it is possible to effectively transfer heat from the base 11 to the substrate 10. Therefore, it is possible to realize the light emitting element mounting package A1 with high heat dissipation performance.

Further, a process of bonding the substrate 10 and the base 11 is not needed and a joint material, such as solder, is also not needed in the light emitting element mounting package A1. Therefore, it is possible to realize the light emitting element mounting package A1 at low manufacturing cost.

Figure 1B:
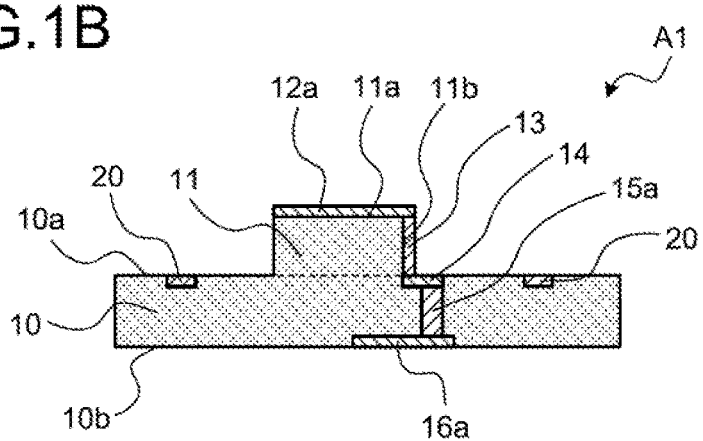
FIG. 1B is a cross-sectional view taken along the direction of arrow A-A in FIG. 1A.

Meanwhile, as illustrated in FIG. 1B, it is preferable to provide a side conductor 13 on a side surface 11b of the base 11 and provide a substrate-side via conductor 15a inside the substrate 10 in the light emitting element mounting package A1. Further, it is preferable to connect the side conductor 13 and the substrate-side via conductor 15a in a thickness direction of the light emitting element mounting package A1.

Thereby, it is possible to transfer heat, which is generated by the light emitting element 30 mounted on the mounting surface 11a, to a back surface 10b of the substrate 10 that has a large surface area and has high heat dissipation performance, by the shortest route via the side conductor 13 and the substrate-side via conductor 15a that extend in the thickness direction. Therefore, it is possible to improve the heat dissipation performance of the light emitting element mounting package A1.

In this case, it is sufficient that the area of the side conductor 13 is equal to or greater than 10%, or more preferably, 50% of the area of the one side surface 11b of the base 11 on which the side conductor 13 is provided. Further, it is more preferable that the area of the side conductor 13 approaches the area of the side surface 11b, and it is acceptable that the area of the side conductor 13 is equal to the area of the side surface 11b.

While the side conductor 13 and the substrate-side via conductor 15a are connected using a flat conductor 14 as illustrated in FIG. 1B, it may be possible to directly connect the side conductor 13 and the substrate-side via conductor 15a without using the flat conductor 14.

Detailed configurations of the light emitting element mounting package A1 will be continuously described below with reference to FIG. 1A to FIG. 1C.

The light emitting element mounting package A1 is made of ceramics. As for the ceramics used herein, for example, alumina, silica, mullite, cordierite, forsterite, aluminum nitride, silicon nitride, silicon carbide, or glass ceramics is appropriate. In addition, from the view point that the light emitting element mounting package A1 has high thermal conductivity and has a thermal expansion rate which is close to that of the light emitting element 30, it is preferable that aluminum nitride (AlN) is contained as a major component.

Herein, the phrase "aluminum nitride is contained as a major component" indicates that the light emitting element mounting package A1 contains 80% by mass or more of aluminum nitride. If the light emitting element mounting package A1 contains less than 80% by mass of aluminum nitride, the thermal conductivity of the light emitting element mounting package A1 is reduced, so that the heat dissipation performance may be degraded.

Further, it is preferable that the light emitting element mounting package A1 contains 90% by mass or more of aluminum nitride. If the content of aluminum nitride is 90% by mass or more, the thermal conductivity of the light emitting element mounting package A1 becomes equal to or higher than 150 W/mK, so that it is possible to realize the light emitting element mounting package A1 with excellent heat dissipation performance.

As described above, the light emitting element mounting package A1 includes the substrate 10 and the base 11, and an element terminal 12a is provided on the mounting surface 11a of the base 11. Further, as illustrated in FIG. 1B, the element terminal 12a is electrically connected to a power supply terminal 16a that is connected to an external power supply (not illustrated), which is provided on the back surface 10b, via the above-described side conductor 13, the flat conductor 14 that is provided on the front surface 10a of the substrate 10, and the above-described substrate-side via conductor 15a.

Furthermore, as illustrated in FIG. 1A, another element terminal 12b is provided on the front surface 10a of the substrate 10 so as to be adjacent to the base 11. Moreover, as illustrated in FIG. 1C, the element terminal 12b is electrically connected to another power supply terminal 16b that is connected to an external power supply provided on the back surface 10b, via another substrate-side via conductor 15b that extends in the thickness direction of the substrate 10, similarly to the element terminal 12a.

Meanwhile, it is sufficient that the element terminals 12a and 12b are formed of metalized films that are sintered metal powder. The metalized films can be bonded to the ceramics surfaces constituting the substrate 10 and the base 11 with high strength, so that it is possible to realize the light emitting element mounting package A1 with high reliability.

Further, it may be possible to provide coated films that are made of Ni on the surfaces of the metalized films. Furthermore, it may be possible to provide solder or Au—Sn coated films on the surfaces of the coated films.

As illustrated in FIG. 1A, a sealing metal film 20 is provided on the front surface 10a of the substrate 10 so as to surround the base 11 and the element terminal 12b. The sealing metal film 20 is a portion to which a cap 40 is bonded when the cap 40 is provided so as to cover the front surface 10a of the substrate 10.

The light emitting element 30 and the cap 40 as illustrated in FIG. 1A are mounted on the light emitting element mounting package A1 as described above, and thus the light emitting device is constructed.

For example, a semiconductor laser (also referred to as a laser diode) may be used as the light emitting element 30. The light emitting element 30 is arranged such that an emitting surface 30a, which is provided on one end surface, faces a predetermined direction of the light emitting element mounting package A1.

The light emitting element 30 is bonded to the mounting surface 11a of the base 11 using a conductive joint material, such as solder. At this time, a first electrode (not illustrated) that is provided on a lower surface of the light emitting element 30 and the element terminal 12a that is provided on the mounting surface 11a are electrically connected to each other by the conductive joint material.

Further, a second electrode (not illustrated) that is provided on an upper surface of the light emitting element 30 and the element terminal 12b that is provided adjacent to the base 11 are electrically connected to each other using bonding wire (not illustrated) or the like.

The cap 40 is a member for realizing airtight sealing of a region, such as the light emitting element 30, that is surrounded by the sealing metal film 20. The cap may be composed of a metallic material, ceramics, or the like. For example, it may be possible to use Kovar (Fe—Ni—Co alloy) from the viewpoint that Kovar has high heat resistance and high heat dissipation performance.

A side window 41 is provided on a side surface of the cap 40, and transparent glass is put in the side window 41. The cap 40 is arranged such that the side window 41 faces the same direction as the emitting surface 30a of the light emitting element 30. Further, light emitted from the emitting surface 30a is emitted to the outside through the side window 41.

It is preferable to use a brazing material to bond the cap 40 and the sealing metal film 20 to each other. By using the brazing material as a joint material, it is possible to improve the airtightness of the region sealed with the cap 40, so that it is possible to improve the reliability of the light emitting device.

Second Embodiment

Next, a configuration of a light emitting element mounting package A2 according to a second embodiment will be described with reference to FIG. 2A to FIG. 2C.

The light emitting element mounting package A2 is different from the light emitting element mounting package A1 as described above in that the power supply terminals 16a and 16b, which are used for connection to external power supplies, are arranged differently. Other components are basically the same as those of the light emitting element mounting package A1, so that the same components are denoted by the same reference signs and detailed explanation thereof will be omitted.

Figure 2A:
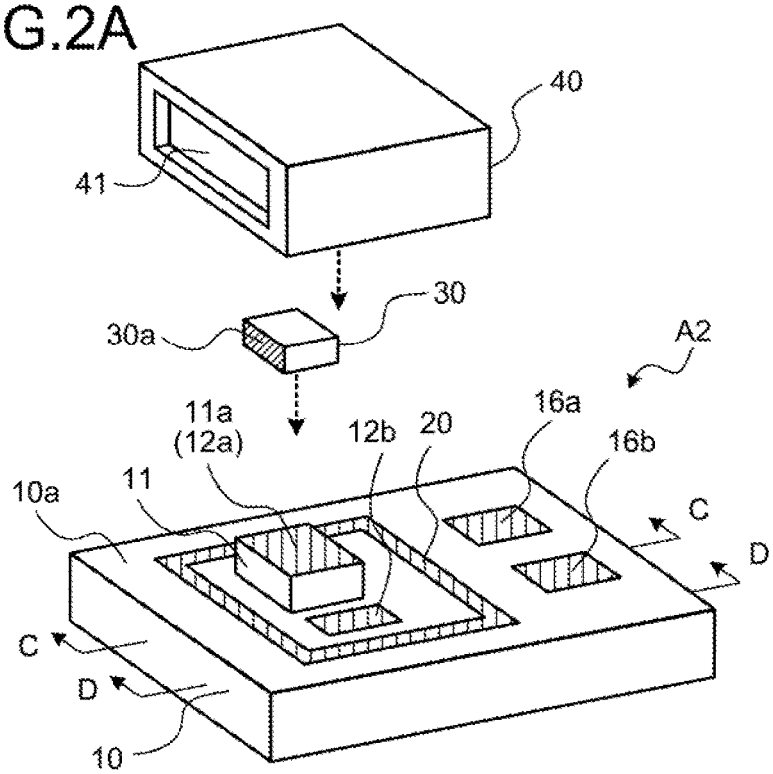
FIG. 2A is a perspective view of an electrical element mounting package according to a second embodiment.

As illustrated in FIG. 2A, etc., the power supply terminals 16a and 16b are provided on the front surface 10a of the substrate 10 in the light emitting element mounting package A2. By providing the power supply terminals 16a and 16b on the front surface 10a instead of the back surface 10b of the substrate 10 as described above, it becomes possible to provide a heat dissipation member, such as a heatsink, so as to come in contact with the entire back surface 10b of the substrate 10. Therefore, it is possible to further improve the heat dissipation performance of the package.

Meanwhile, when a heat dissipation member that is made of metal with high heat dissipation performance is provided on the back surface 10b of the substrate 10, it is preferable to provide a metal film 21 on the back surface 10b in order to enable bonding using solder or the like. By bonding the heat dissipation member using solder or the like that has relatively high thermal conductivity, it becomes possible to reduce thermal resistance at the bonded portion as compared to a case in which bonding is performed with resin adhesive that has low thermal conductivity. Therefore, it is possible to further improve the heat dissipation performance of the package.

In this case, it is preferable that the area ratio of the metal film on the back surface 10b is equal to or higher than 50%, or more preferably, equal to or higher than 80%. Further, it is preferable that the planar shape of the metal film 21 is similar to the planar shape of the back surface 10b of the substrate 10. Furthermore, if the area of the metal film 21 is less than the area of the back surface 10b, it is preferable to arrange the metal film 21 such that a central portion thereof is located right under the base 11.

In the following, as a difference from the first embodiment as described above, a wiring structure between the power supply terminals 16a and 16b that are provided on the front surface 10a of the substrate 10 and the element terminals 12a and 12b that are provided on the inner side of the sealing metal film 20 will be described.

Figure 2B:
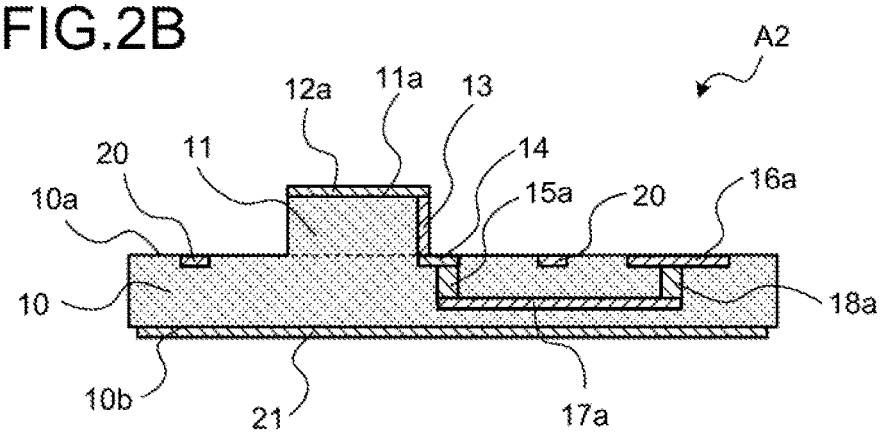
FIG. 2B is a cross-sectional view taken along the direction of arrow C-C in FIG. 1A.

As illustrated in FIG. 2B, similarly to the light emitting element mounting package A1 as described above, the side conductor 13, the flat conductor 14, and the substrate-side via conductor 15a are connected to the element terminal 12a in this order. However, the substrate-side via conductor 15a does not penetrate to the back surface 10b of the substrate 10, but is connected to one end side of a wiring conductor 17a that extends in a surface direction of the substrate 10 inside the substrate 10.

The wiring conductor 17a extends such that the other end side thereof reaches the lower side of the power supply terminal 16a through the lower side of the sealing metal film 20. Further, the other end side of the wiring conductor 17a and the power supply terminal 16a are electrically connected to each other by an element-side via conductor 18a.

In other words, the power supply terminal 16a is electrically connected to the element terminal 12a via the element-side via conductor 18a, the wiring conductor 17a, the substrate-side via conductor 15a, the flat conductor 14, and the side conductor 13.

Figure 2C:
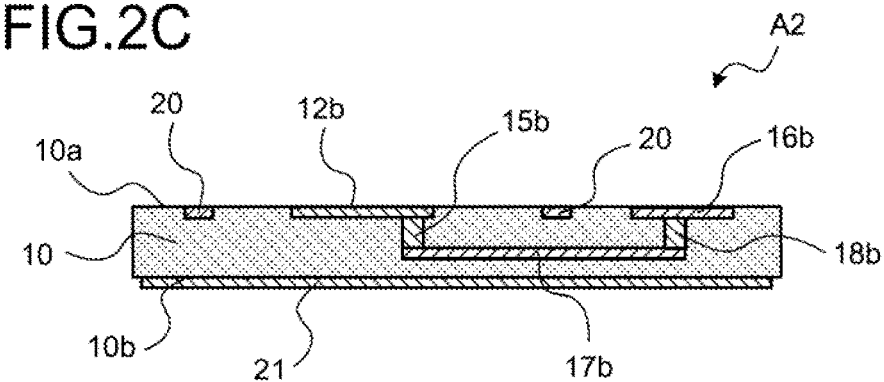
FIG. 2C is a cross-sectional view taken along the direction of arrow D-D in FIG. 1B.

Further, as illustrated in FIG. 2C, the power supply terminal 16b is electrically connected to the element terminal 12b via another element-side via conductor 18b, another wiring conductor 17b, and another substrate-side via conductor 15b.

Thus, the light emitting element mounting package A2 is configured such that the wiring conductors 17a and 17b and the sealing metal film 20 three-dimensionally intersect with each other via at least one insulating layer that constitutes the substrate 10. Thereby, by interposing the insulating layer, it is possible to reduce generation of irregularities on the surface of the sealing metal film 20 that three-dimensionally intersects with the wiring conductors 17a and 17b, due to the thicknesses of the wiring conductors 17a and 17b.

In other words, it is possible to reduce a gap that is formed on a bonding surface when the cap 40 is bonded to the surface of the sealing metal film 20, so that it is possible to improve the airtightness inside the cap 40. Therefore, it is possible to improve reliability of the light emitting device.

Further, as illustrated in FIG. 2B and FIG. 2C, it is preferable to provide the wiring conductors 17a and 17b at positions that are closer to the back surface 10b than the front surface 10a of the substrate 10. When the wiring conductors 17a and 17b made of metal are provided at positions that are closer to the back surface 10b, and if a heat dissipation member made of metal is provided on the back surface 10b, it is possible to reduce a difference between a thermal expansion coefficient of the heat dissipation member and a thermal expansion coefficient of the substrate 10.

Thereby, it is possible to prevent, at the bonded portion between the heat dissipation member and the back surface 10b, deterioration of a joint material provided in the bonded portion due to a heat cycle that occurs when the light emitting device operates. Therefore, it is possible to realize the light emitting element mounting package A2 with high reliability.

<Variations>

Figure 3A:
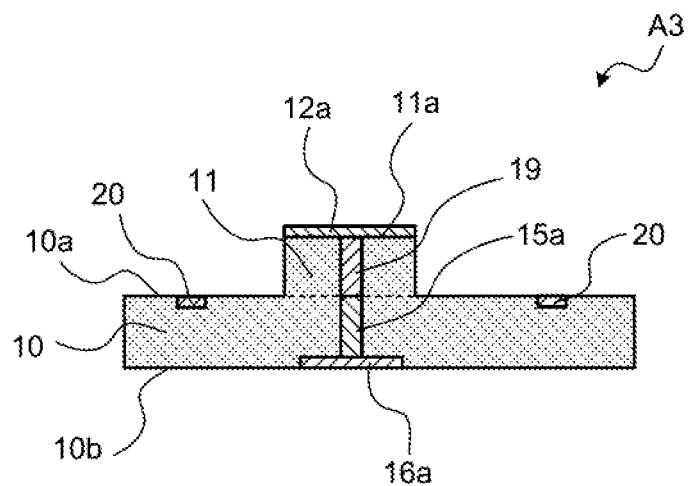
FIG. 3A is a cross-sectional view of an electrical element mounting package according to a first variation of the embodiments.

Next, various variations of the light emitting element mounting package according to the embodiments will be described with reference to FIG. 3A to FIG. 7C. A light emitting element mounting package A3 illustrated in FIG. 3A is a variation of the light emitting element mounting package A1 according to the first embodiment, and FIG. 3A is a cross-sectional view corresponding to FIG. 1B.

In the light emitting element mounting package A3, the element terminal 12a and the substrate-side via conductor 15a are electrically connected to each other by a base-side via conductor 19 that is provided inside the base 11 and extends in a thickness direction of the base 11, instead of the side conductor 13 (see FIG. 1B).

Thus, by providing, in the base 11, the base-side via conductor 19 that has a columnar shape with a volume greater than that of the side conductor 13 that has a thin film shape, it is possible to more effectively transfer heat generated by the light emitting element 30 (see FIG. 1A) to the back surface 10b of the substrate 10. Therefore, it is possible to further improve the heat dissipation performance of the light emitting element mounting package A3.

It is preferable to arrange the base-side via conductor 19 in the center of the mounting surface 11a that is provided on the upper surface of the base 11. Thereby, it becomes possible to more easily transfer heat from an inner portion that is far from the side surface 11b inside the base 11.

Further, as illustrated in FIG. 3A, it is preferable that the base-side via conductor 19 and the substrate-side via conductor 15a are integrally formed so as to penetrate in the thickness direction of the base 11 and the substrate 10. Thereby, it is possible to easily form the base-side via conductor 19 and the substrate-side via conductor 15a through a via embedding process that is performed in a manufacturing process to be described later. Therefore, it is possible to prevent an increase in manufacturing cost of the light emitting element mounting package A3.

Figure 3B:
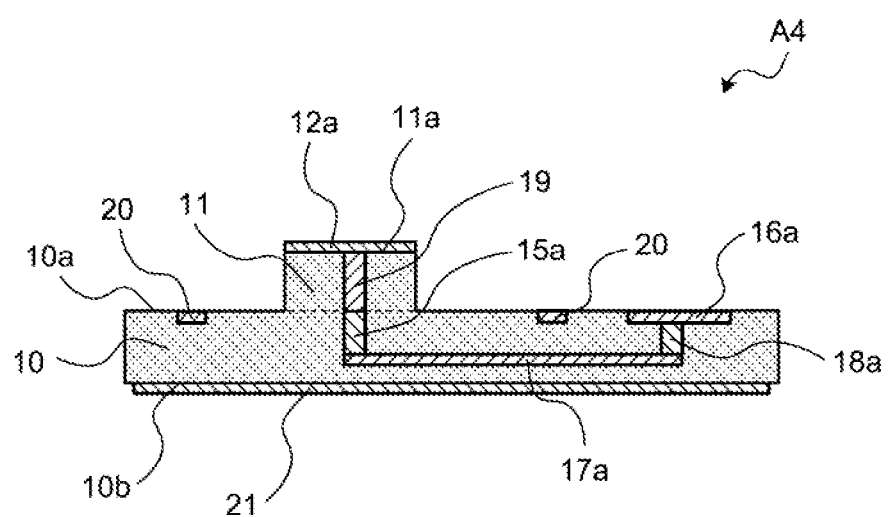
FIG. 3B is a cross-sectional view of an electrical element mounting package according to a second variation of the embodiments.

A light emitting element mounting package A4 illustrated in FIG. 3B is a variation of the light emitting element mounting package A2 according to the second embodiment, and FIG. 3B is a cross-sectional view corresponding to FIG. 2B.

In the light emitting element mounting package A4, similarly to the variation as described above, the element terminal 12a and the substrate-side via conductor 15a are electrically connected to each other by the base-side via conductor 19 that is arranged inside the base 11. Therefore, as described above, it is possible to further improve the heat dissipation performance of the package. Even in this case, it is preferable to set the shape and the position of the metal film 21 that is arranged on the back surface 10b of the substrate 10 in the same manner as the light emitting element mounting package A2 as described above.

Figure 3C:
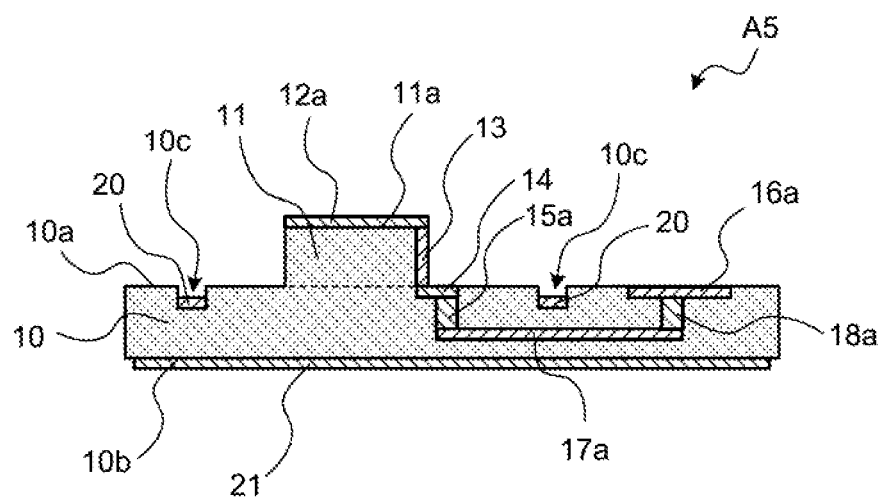
FIG. 3C is a cross-sectional view of an electrical element mounting package according to a third variation of the embodiments.

A light emitting element mounting package A5 illustrated in FIG. 3C is another variation of the light emitting element mounting package A2 according to the second embodiment.

In the light emitting element mounting package A5, a groove 10c is provided on the front surface 10a of the substrate 10 so as to surround the base 11 and the element terminal 12b (see FIG. 2A), and the sealing metal film 20 is provided on a bottom surface of the groove 10c.

In this example, by mounting the cap 40 (see FIG. 2A) so as to be engaged with the groove 10c when the cap 40 is bonded to the sealing metal film 20, the bonded portion of the cap 40 is extended to side surfaces of the groove 10*c*. Thereby, it is possible to further improve the airtightness of the region sealed with the cap 40, so that it is possible to further improve the reliability of the light emitting device.

Further, by providing the groove 10*c* on the substrate 10, it is possible to increase the surface area of the substrate 10 that has a heat dissipation function, so that it is possible to further improve the heat dissipation performance of the package.

Meanwhile, while the sealing metal film 20 is provided on the bottom surface of the groove 10*c* in FIG. 3C, the sealing metal film 20 need not be always arranged in this manner. For example, the sealing metal film 20 may be provided so as to extend from the bottom surface of the groove 10*c* to the side surfaces of the groove 10*c* or to the front surface 10*a* of the substrate 10 in the vicinity of the groove 10*c*.

Figure 3D:
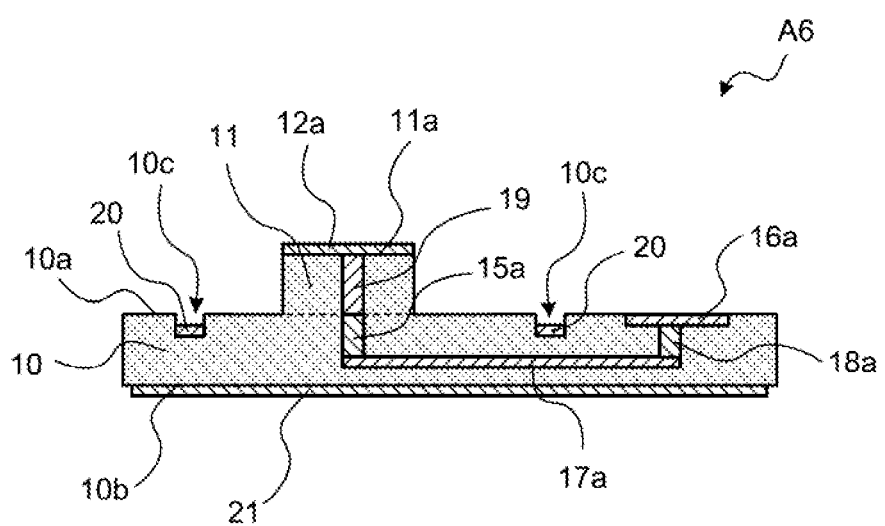
FIG. 3D is a cross-sectional view of an electrical element mounting package according to a fourth variation of the embodiments.

A light emitting element mounting package A6 illustrated in FIG. 3D is a variation of the light emitting element mounting package A4 illustrated in FIG. 3B.

In the light emitting element mounting package A6, the sealing metal film 20 is provided inside the groove 10*c* that is provided on the front surface 10*a* of the substrate 10, similarly to the light emitting element mounting package A5. Therefore, as described above, it is possible to further improve the reliability of the light emitting device, and further improve the heat dissipation performance of the package.

Figure 4A:
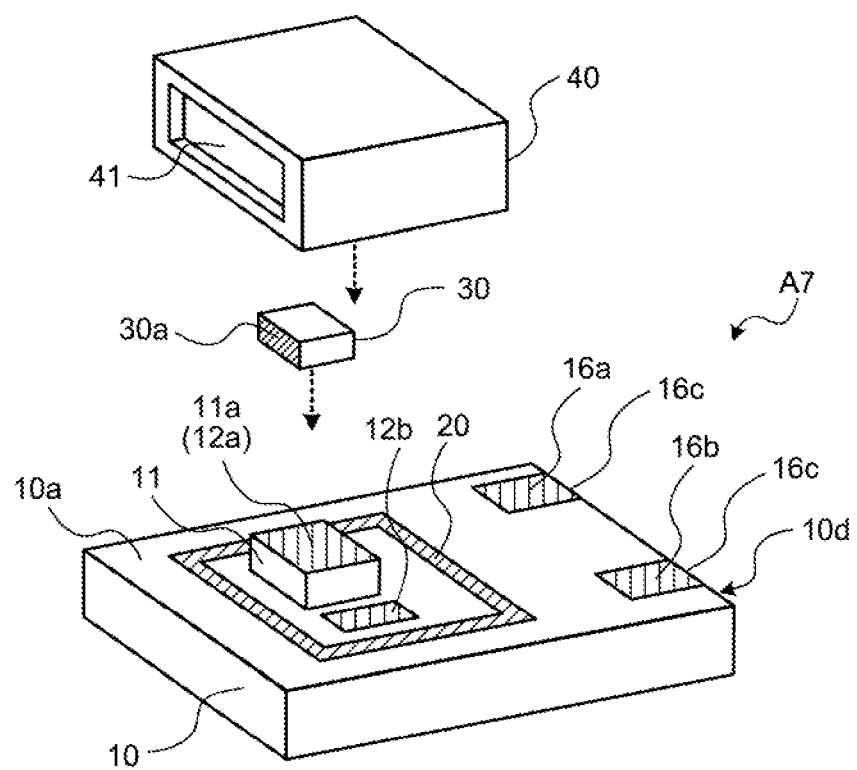
FIG. 4A is a perspective view of an electrical element mounting package according to a fifth variation of the embodiments.

A light emitting element mounting package A7 illustrated in FIG. 4A is another variation of the light emitting element mounting package A2 according to the second embodiment.

In the light emitting element mounting package A7, edges 16*c* on a side opposite to a light emitting direction (hereinafter, the side is also referred to as a "rear side") of the power supply terminals 16*a* and 16*b* having rectangular shapes are provided so as to fit an edge of an end surface of the substrate 10 on the rear side. Thus, by displacing the power supply terminals 16*a* and 16*b* to an end portion of the substrate 10, it is possible to reduce a useless substrate area on the substrate 10, so that it is possible to reduce the size of the light emitting device.

Further, in the light emitting element mounting package A7, it becomes easy to use a flexible printed circuit board (FPC) as an external terminal that is connected to each of the power supply terminals 16*a* and 16*b*. This reason will be described below with reference to FIG. 4B and FIG. 4C.

Figure 4B:
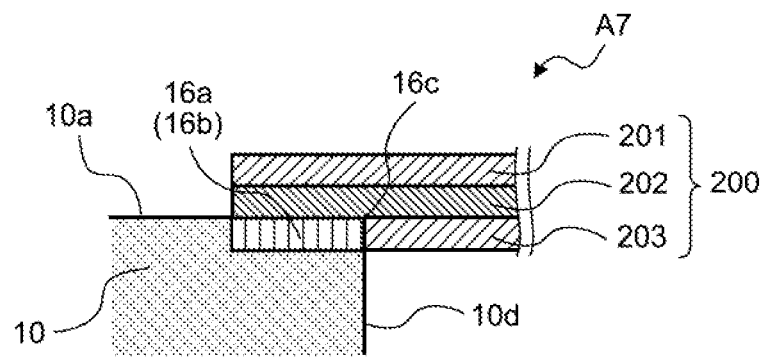
FIG. 4B is an enlarged cross-sectional view of the electrical element mounting package according to the fifth variation of the embodiments.

As illustrated in FIG. 4B, an FPC 200 is formed by laminating a coverlay film 201, a copper foil 202, and a base film 203 in this order from the top. Further, the copper foil 202 that is an intermediate layer and each of the power supply terminals 16*a* and 16*b* is bonded using a conductive joint material, such as solder, so that each of the power supply terminals 16*a* and 16*b* and the FPC 200 are electrically connected.

Herein, as illustrated in FIG. 4B, when the edges 16*c* of the power supply terminals 16*a* and 16*b* are provided so as to fit the edge of an end surface 10*d*, it is possible to easily connect the FPC 200 to each of the power supply terminals 16*a* and 16*b* while keeping the FPC 200 flat by cutting an end portion of the base film 203 that is the lower layer.

Figure 4C:
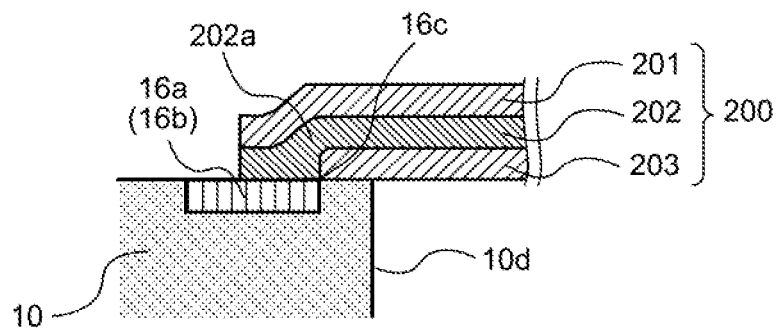
FIG. 4C is an enlarged cross-sectional view of a connection portion in which an edge of a power supply terminal does not fit an edge of an end surface.

In contrast, as illustrated in FIG. 4C, when the edges 16*c* of the power supply terminals 16*a* and 16*b* do not fit the edge of the end surface 10*d*, it is not possible to connect the FPC 200 to each of the power supply terminals 16*a* and 16*b* unless a bending portion 202*a* is additionally provided in an end portion of the copper foil 202 of the FPC 200. Further, in this case, there is the possibility that the durability of the connection portion between the FPC 200 and each of the power supply terminals 16*a* and 16*b* may be degraded due to the bending portion 202*a*.

However, in the light emitting element mounting package A7, it is possible to connect the FPC 200 to each of the power supply terminals 16*a* and 16*b* while the FPC 200 is kept flat. Therefore, it is possible to improve the durability of the connection portion between the FPC 200 and each of the power supply terminals 16*a* and 16*b*.

Figure 4D:
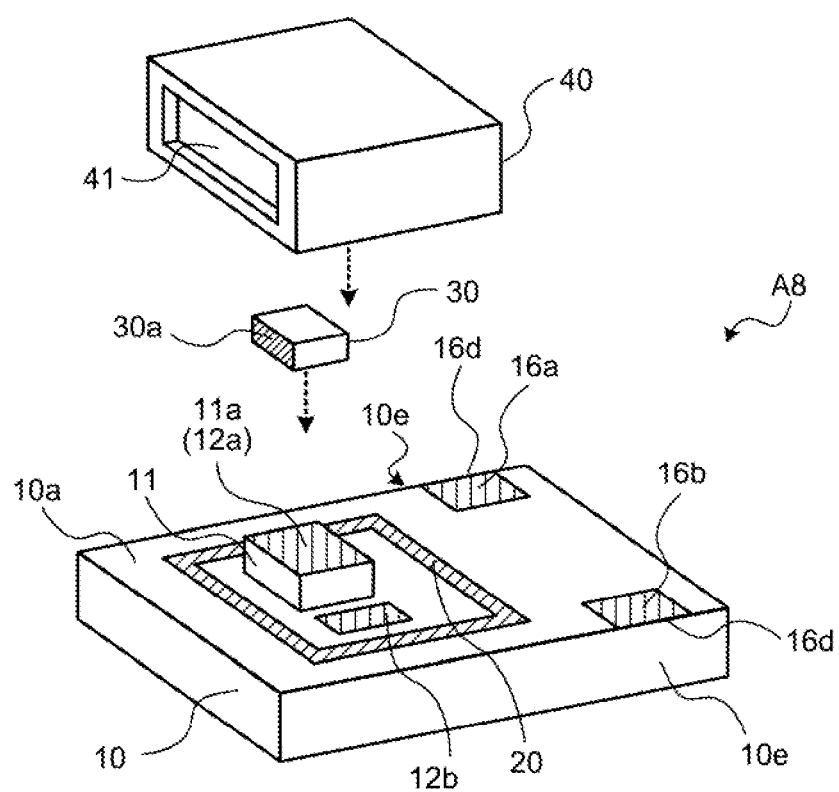
FIG. 4D is a perspective view of an electrical element mounting package according to a sixth variation of the embodiments.

A light emitting element mounting package A8 illustrated in FIG. 4D is another variation of the light emitting element mounting package A2 according to the second embodiment.

In the light emitting element mounting package A8, edges 16*d* of the rectangular power supply terminals 16*a* and 16*b* on vertical sides (hereinafter, also referred to as "lateral sides") with respect to the light emitting direction are provided so as to fit edges of side surfaces 10*e* that are end surfaces on the lateral sides of the substrate 10. Thereby, it is possible to increase the flexibility in connecting an external terminal, such as the FPC 200 (see FIG. 4B), so that it is possible to facilitate module design of the light emitting device.

Further, as described above, when the edges 16*d* of the power supply terminals 16*a* and 16*b* are provided so as to fit the edges of the side surfaces 10*e*, it is possible to connect the FPC 200 to each of the power supply terminals 16*a* and 16*b* while keeping the FPC 200 flat by cutting an end portion of the base film 203. Therefore, it is possible to improve the durability of the connection portion between the FPC 200 and each of the power supply terminals 16*a* and 16*b*.

Figure 5A:
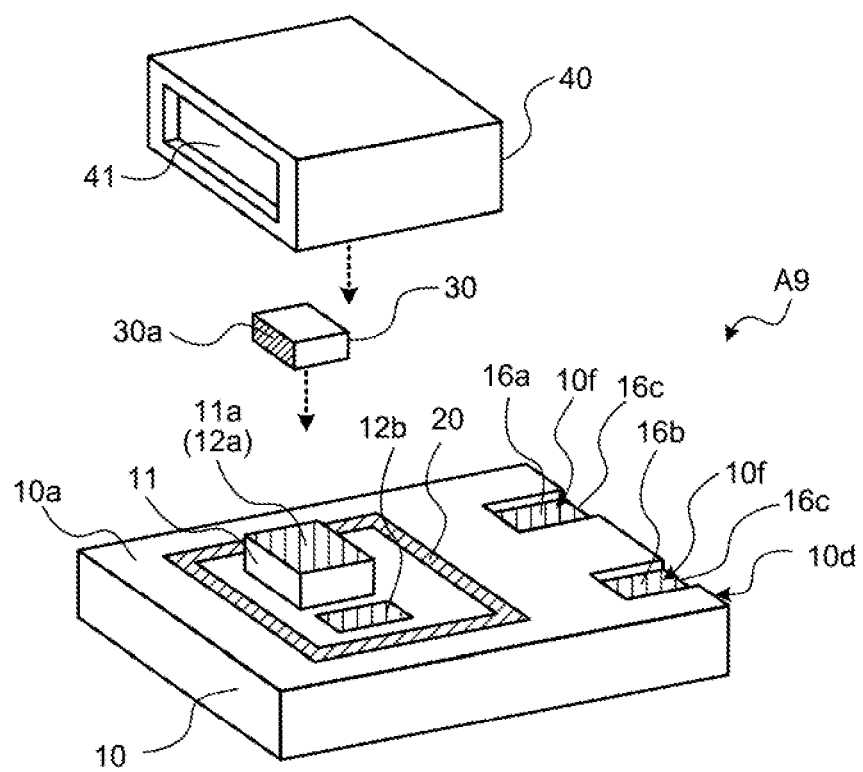
FIG. 5A is a perspective view of an electrical element mounting package according to a seventh variation of the embodiments.

A light emitting element mounting package A9 illustrated in FIG. 5A is a variation of the light emitting element mounting package A7 illustrated in FIG. 4A. In the light emitting element mounting package A9, the rear side edges 16*c* of the rectangular power supply terminals 16*a* and 16*b* are provided so as to fit the edge of the rear side end surface 10*d* of the substrate 10.

Thereby, similarly to the light emitting element mounting package A7 as illustrated in FIG. 4A, it is possible to connect the FPC 200 to each of the power supply terminals 16*a* and 16*b* while keeping the FPC 200 flat even in the light emitting element mounting package A9. Therefore, it is possible to improve the durability of the connection portion between the FPC 200 and each of the power supply terminals 16*a* and 16*b*.

Further, in the light emitting element mounting package A9, the power supply terminals 16*a* and 16*b* are provided at positions that are one step lower than the front surface 10*a* of the substrate 10. In other words, concave portions 10*f* are provided at the rear side edge of the front surface 10*a* of the substrate 10, and the power supply terminals 16*a* and 16*b* are arranged on bottom surfaces of the concave portions 10*f*.

Figure 5B:
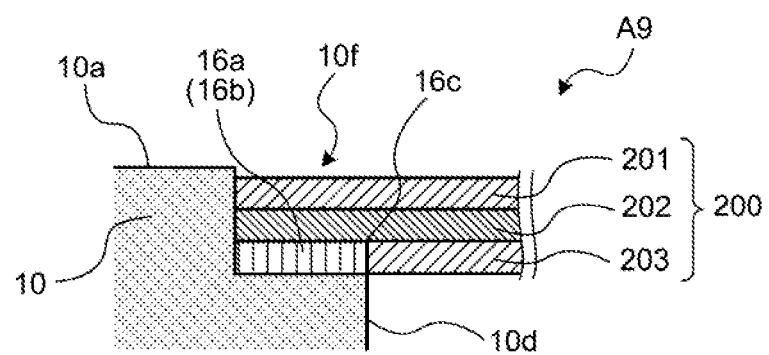
FIG. 5B is an enlarged cross-sectional view of an electrical element mounting package according to the seventh variation of the embodiments.

Thereby, as illustrated in FIG. 5B, when the FPC 200 is connected to each of the power supply terminals 16*a* and 16*b*, it is possible to push an end portion of the FPC 200 against a side wall of the concave portion 10*f* to mount the FPC 200. Therefore, it is possible to easily determine the position of the FPC 200 and firmly connect the FPC 200 to each of the power supply terminals 16*a* and 16*b*.

Furthermore, as illustrated in FIG. 5B, by setting depths of the concave portions 10*f* to be equal to or greater than a sum of the thicknesses of the coverlay film 201 and the copper foil 202 of the FPC 200, an upper surface of the FPC 200 can be positioned flush with the front surface 10*a* of the substrate 10 or can be positioned lower than the front surface 10*a*.

Thereby, the FPC 200 is less likely to be damaged, so that it is possible to improve the durability of the light emitting device.

Figure 5C:
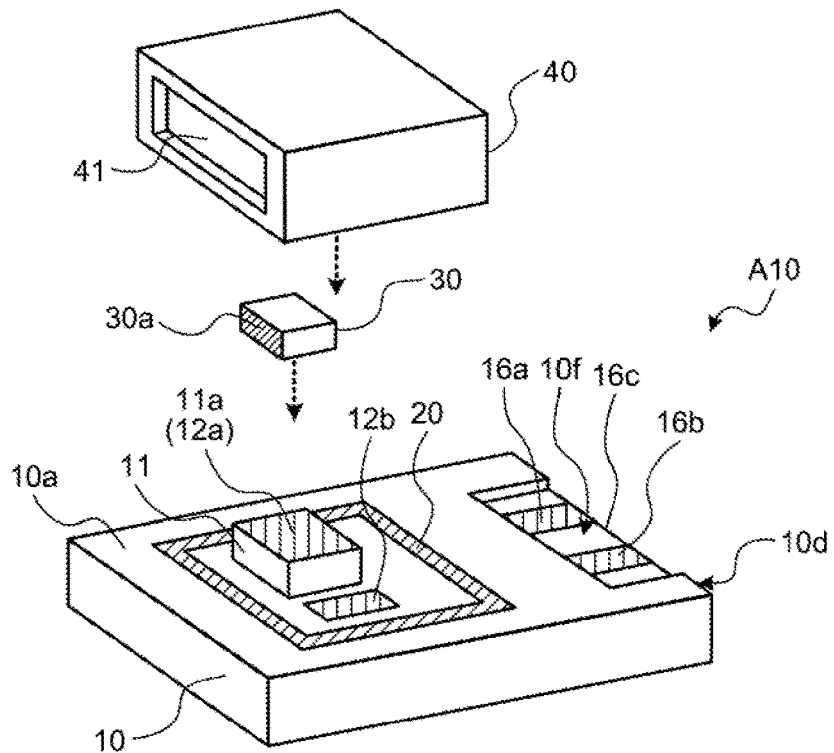
FIG. 5C is a perspective view of an electrical element mounting package according to an eighth variation of the embodiments.

Meanwhile, the concave portions 10*f* may be separated from each other on the front surface 10*a* of the substrate 10 as illustrated in FIG. 5A, or the two concave portions 10*f* may be integrated as in a light emitting element mounting package A10 illustrated in FIG. 5C. In this case, it is possible to arrange the power supply terminals 16*a* and 16*b* at close positions, so that it is possible to reduce the sizes of the light emitting element mounting package A10 and an external terminal, such as the FPC 200.

Figure 5D:
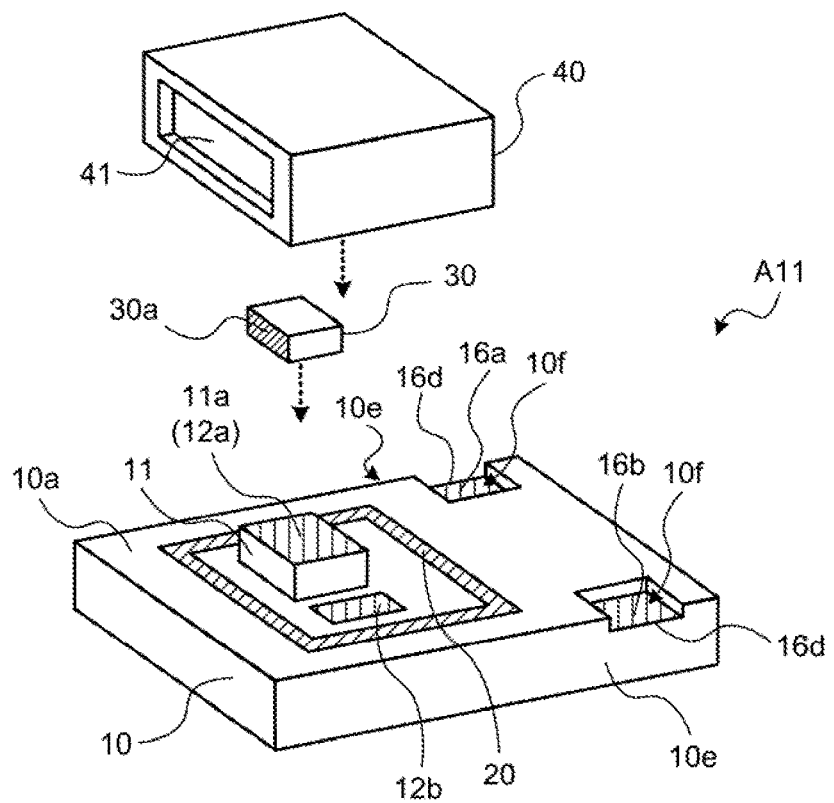
FIG. 5D is a perspective view of an electrical element mounting package according to a ninth variation of the embodiments.

A light emitting element mounting package A11 illustrated in FIG. 5D is a variation of the light emitting element mounting package A8 illustrated in FIG. 4D. In the light emitting element mounting package A11, the lateral side edges 16*d* of the rectangular power supply terminals 16*a* and 16*b* are provided so as to fit the edges of the side surfaces 10*e* that are the end surfaces on the lateral sides of the substrate 10. Thereby, it is possible to increase the flexibility in connecting an external terminal, such as the FPC 200, so that it is possible to facilitate module design of the light emitting device.

Further, in the light emitting element mounting package A11, the power supply terminals 16*a* and 16*b* are provided at positions that are one step lower than the front surface 10*a* of the substrate 10, similarly to the light emitting element mounting package A9 as illustrated in FIG. 5A. In other words, the concave portions 10*f* are provided at the lateral side edges of the front surface 10*a* of the substrate 10, and the power supply terminals 16*a* and 16*b* are arranged on the bottom surfaces of the concave portions 10*f*.

Thereby, as described above, when the FPC 200 is connected to each of the power supply terminals 16*a* and 16*b*, it is possible to push an end portion of the FPC 200 against a side wall of the concave portion 10*f* to mount the FPC 200. Therefore, it is possible to easily determine the position of the FPC 200 and firmly connect the FPC 200 to each of the power supply terminals 16*a* and 16*b*.

Furthermore, as described above, by setting the depths of the concave portions 10*f* to be equal to or greater than a sum of the thicknesses of the coverlay film 201 and the copper foil 202 of the FPC 200, the upper surface of the FPC 200 can be positioned flush with the front surface 10*a* of the substrate 10 or can be positioned lower than the front surface 10*a*.

Thereby, the FPC 200 is less likely to be damaged, so that it is possible to improve the durability of the light emitting device.

Figure 5E:
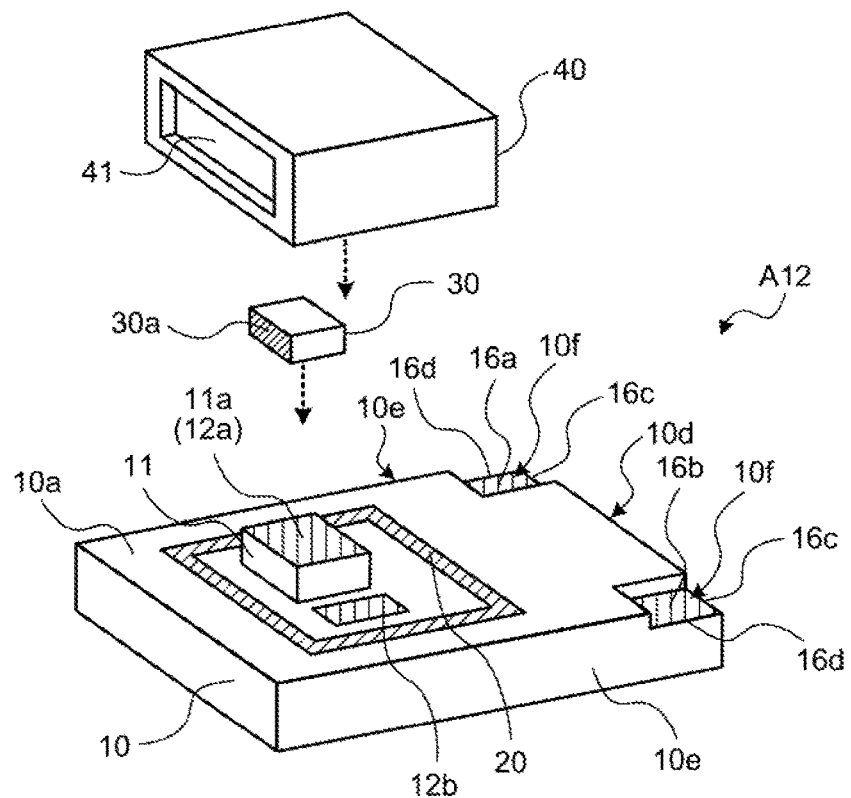
FIG. 5E is a perspective view of an electrical element mounting package according to a tenth variation of the embodiments.

A light emitting element mounting package A12 illustrated in FIG. 5E is a variation of the light emitting element mounting package A9 illustrated in FIG. 5A. In the light emitting element mounting package A12, the rear side edges 16*c* of the rectangular power supply terminals 16*a* and 16*b* are provided so as to fit the edge of the rear side end surface 10*d* of the substrate 10.

Thereby, it is possible to connect the FPC 200 to each of the power supply terminals 16*a* and 16*b* while keeping the FPC 200 flat in the light emitting element mounting package A12, similarly to the light emitting element mounting package A7 as illustrated in FIG. 4A. Therefore, it is possible to improve the durability of the connection portion between the FPC 200 and each of the power supply terminals 16*a* and 16*b*.

Further, in the light emitting element mounting package A12, the lateral side edges 16*d* of the rectangular power supply terminals 16*a* and 16*b* are arranged so as to fit the edges of the lateral side surfaces 10*e* of the substrate 10. Thereby, it is possible to increase the flexibility in connecting an external terminal, such as the FPC 200, so that it is possible to facilitate module design of the light emitting device.

Furthermore, in the light emitting element mounting package A12, the power supply terminals 16*a* and 16*b* are provided at positions that are one step lower than the front surface 10*a* of the substrate 10. In other words, the concave portions 10*f* are provided at the lateral rear side edges of the front surface 10*a* of the substrate 10, and the power supply terminals 16*a* and 16*b* are arranged on the bottom surfaces of the concave portions 10*f*.

Thereby, when the FPC 200 is connected to each of the power supply terminals 16*a* and 16*b*, it is possible to push end portions of the FPC 200 against two side walls of the concave portion 10*f* in an oblique direction to mount the FPC 200. Therefore, it is possible to easily determine the position of the FPC 200 and firmly connect the FPC 200 even in the oblique direction.

Moreover, as described above, by setting the depths of the concave portions 10*f* to be equal to or greater than a sum of the thicknesses of the coverlay film 201 and the copper foil 202 of the FPC 200, the upper surface of the FPC 200 can be positioned flush with the front surface 10*a* of the substrate 10 or can be positioned lower than the front surface 10*a*.

Thereby, the FPC 200 is less likely to be damaged, so that it is possible to improve the durability of the light emitting device.

Figure 5F:
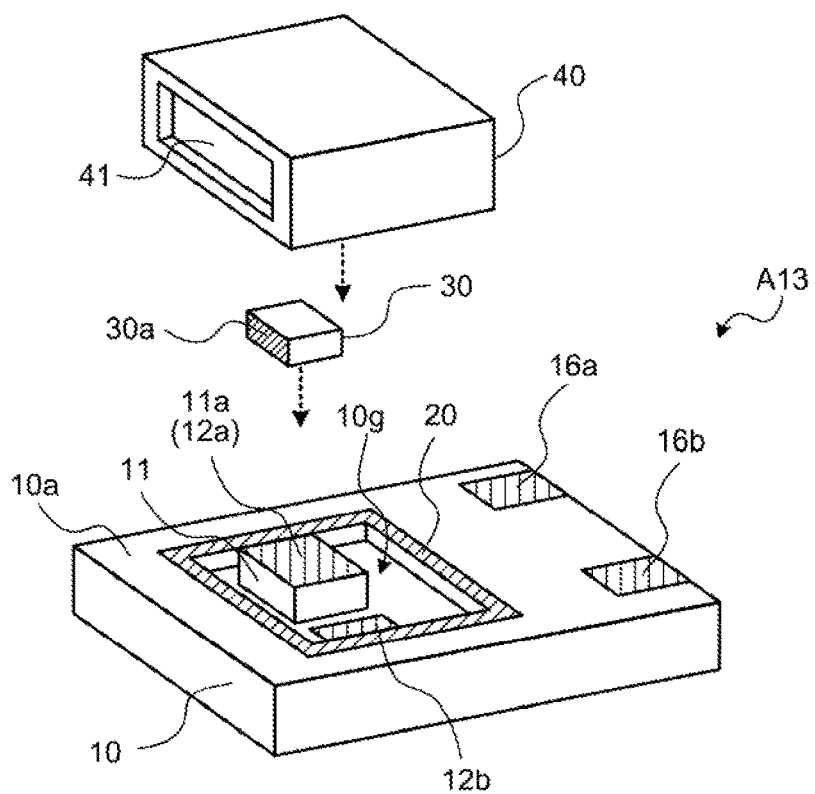
FIG. 5F is a perspective view of an electrical element mounting package according to an eleventh variation of the embodiments.

A light emitting element mounting package A13 illustrated in FIG. 5F is a variation of the light emitting element mounting package A7 illustrated in FIG. 4A. In the light emitting element mounting package A13, an inner region of the sealing metal film 20 is recessed from the front surface 10*a* of the substrate 10 except for a portion corresponding to the base 11. In other words, a concave portion 10*g* is provided in the inner region of the sealing metal film 20, and the base 11 is arranged on a bottom surface of the concave portion 10*g*. Herein, the mounting surface 11*a* of the base 11 is positioned higher than the front surface 10*a* of the substrate 10.

Thereby, in the light emitting element mounting package A13, it is possible to lower the position of the mounting surface 11*a* that is located at the highest position, so that it is possible to further reduce the height of the light emitting device.

Herein, if the height of the base is simply reduced without forming the concave portion 10*g* in order to reduce the height of the light emitting element mounting package, a distance between the mounting surface and the front surface of the substrate in the inner region of the sealing metal film is reduced. In other words, a distance between the light emitting element mounted on the mounting surface and the front surface is reduced in the inner region of the sealing metal film.

Thereby, most of light that is emitted from the emitting surface of the light emitting element in an obliquely downward direction is applied to the front surface in the inner region of the sealing metal film, so that the amount of light that is reflected from the front surface in directions other than a predetermined irradiation direction increases. Therefore, a defect, such as reduction of luminous efficiency inside the light emitting device, is likely to occur.

However, in the light emitting element mounting package A13, the concave portion 10*g* is provided in the inner region of the sealing metal film 20, so that it is possible to secure, in the inner region of the sealing metal film 20, a distance between the mounting surface 11a and the concave portion 10g that is located in the vicinity of the mounting surface 11a and serves as a surface on the front surface 10a side of the substrate 10. Therefore, it is possible to suppress reflection of light from the surface on the front surface 10a side in the inner region of the sealing metal film 20.

In other words, according to the light emitting element mounting package A13, it is possible to further reduce the height of the light emitting device and suppress reflection of light from the surface on the front surface 10a side.

A light emitting element mounting package A14 illustrated in FIG. 5G is a variation of the light emitting element mounting package A13 illustrated in FIG. 5F. In the light emitting element mounting package A14, the inner region of the sealing metal film 20 is recessed from the front surface 10a of the substrate 10 except for a portion corresponding to the base 11. Thereby, it is possible to further reduce the height of the light emitting device and suppress reflection of light from the surface on the front surface 10a side.

Furthermore, in the light emitting element mounting package A14, the rear side edges 16c of the rectangular power supply terminals 16a and 16b are provided so as to fit the edge of the rear side end surface 10d of the substrate 10.

Thereby, it is possible to connect the FPC 200 to each of the power supply terminals 16a and 16b while keeping the FPC 200 flat in the light emitting element mounting package A14, similarly to the light emitting element mounting package A12 as illustrated in FIG. 5E. Therefore, it is possible to improve the durability of the connection portion between the FPC 200 and each of the power supply terminals 16a and 16b.

Moreover, in the light emitting element mounting package A14, the lateral side edges 16d of the rectangular power supply terminals 16a and 16b are provided so as to fit the edges of the lateral side surfaces 10e of the substrate 10. Thereby, it is possible to increase the flexibility in connecting an external terminal, such as the FPC 200, so that it is possible to facilitate module design of the light emitting device.

Furthermore, in the light emitting element mounting package A14, the power supply terminals 16a and 16b are provided at positions that are one step lower than the front surface 10a of the substrate 10. In other words, the concave portions 10f are provided at the lateral rear side edges of the front surface 10a of the substrate 10, and the power supply terminals 16a and 16b are arranged on the bottom surfaces of the concave portions 10f.

Thereby, when the FPC 200 is connected to each of the power supply terminals 16a and 16b, it is possible to push end portions of the FPC 200 against two side walls of the concave portion 10f in an oblique direction to mount the FPC 200. Therefore, it is possible to easily determine the position of the FPC 200 and firmly connect the FPC 200 even in the oblique direction.

Moreover, as described above, by setting the depths of the concave portions 10f to be equal to or greater than a sum of the thicknesses of the coverlay film 201 and the copper foil 202 of the FPC 200, the upper surface of the FPC 200 can be positioned flush with the front surface 10a of the substrate 10 or can be positioned lower than the front surface 10a.

Thereby, the FPC 200 is less likely to be damaged, so that it is possible to improve the durability of the light emitting device.

A light emitting element mounting package A15 illustrated in FIG. 6A is a variation of the light emitting element mounting package A7 illustrated in FIG. 4A. In the light emitting element mounting package A15, the plurality of bases 11 (two in the figure) are provided in the inner region of the sealing metal film 20.

Thereby, it is possible to mount the plurality of light emitting elements 30 in the inner region of the sealing metal film 20. In other words, it is possible to realize a multi-chip in the light emitting device, so that it is possible to reduce the size of the light emitting device.

In the light emitting element mounting package A15, for example, the bases 11 are arranged in a direction perpendicular to the light emitting direction, and the light emitting elements 30 are mounted on the mounting surfaces 11a of the bases 11. In this case, it is sufficient to arrange all of the light emitting elements 30 such that the emitting surfaces 30a are oriented toward the light emitting direction.

While the example has been described in which the two bases 11 are provided in the embodiments, it is possible to provide the three or more bases 11. Further, in the embodiments, the bases 11 are arranged in the direction perpendicular to the light emitting direction. However, as long as light emitted from at least one of the light emitting elements 30 is prevented from hitting the other light emitting element 30 and the other base 11, the light emitting elements 30 need not always be arranged in the direction perpendicular to the light emitting direction.

Figure 6B:
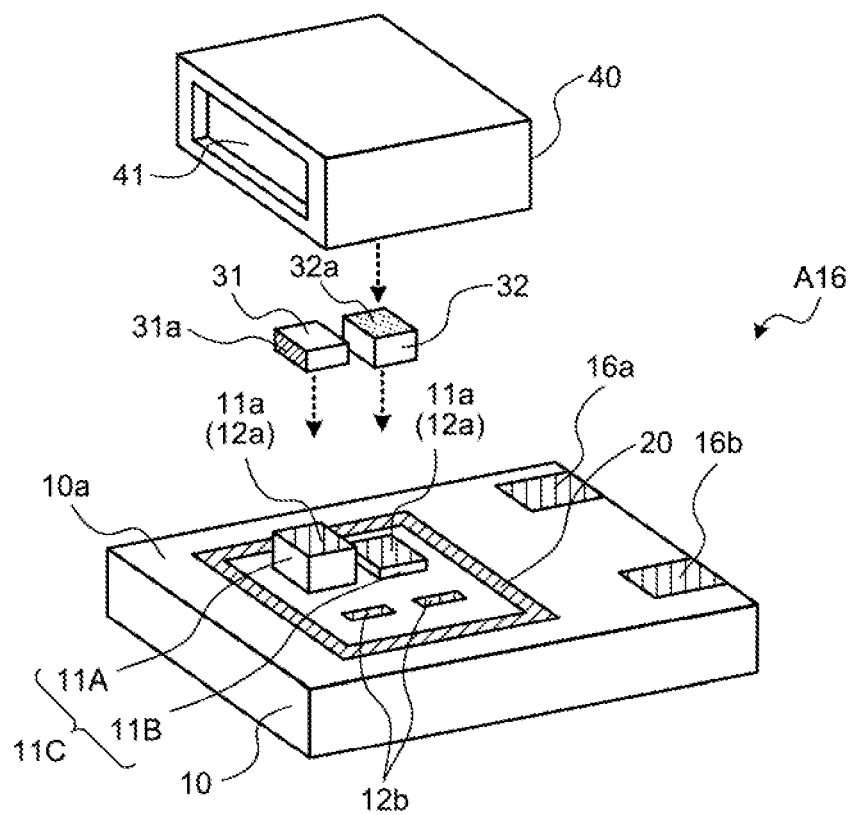
FIG. 6B is a perspective view of an electrical element mounting package according to a fourteenth variation of the embodiments.
Figure 6C:
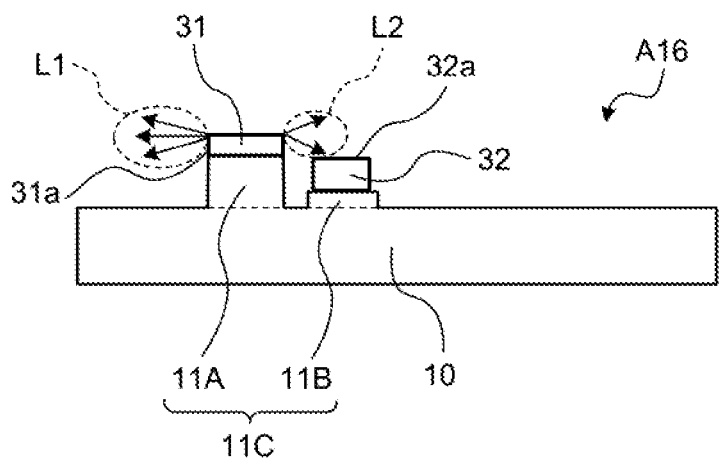
FIG. 6C is a side view of the electrical element mounting package according to the fourteenth variation of the embodiments.

A light emitting element mounting package A16 illustrated in FIG. 6B and FIG. 6C is a variation of the light emitting element mounting package A15 illustrated in FIG. 6A. In the light emitting element mounting package A16, a first base 11A for mounting a laser diode 31, which is one example of the light emitting element 30, and a second base 11B for mounting a photodiode 32 are provided in the inner region of the sealing metal film 20.

The first base 11A and the second base 11B in combination constitute a composite base 11C. In the composite base 11C, the first base 11A is arranged on the light irradiation direction side, and the second base 11B is arranged on the side opposite to the light irradiation direction side. Further, a height of the second base 11B is less than the height of the first base 11A.

The laser diode 31 mounted on the composite base 11C as described above has a dimension of, for example, width of 0.3 millimeters (mm)×length of 1.0 mm×height of 0.1 mm, and the photodiode 32 has a dimension of, for example, width of 0.5 mm×length of 0.5 mm×height of 0.3 mm. Herein, the "width" is a dimension of one side in a direction that is approximately perpendicular to the horizontal direction and the light emitting direction, and the "length" is a dimension of one side in a direction that is approximately parallel to the horizontal direction and the light emitting direction (the same applies to the following description).

Further, as illustrated in FIG. 6C, an emitting surface 31a of the laser diode 31 is arranged so as to face the light irradiation direction, and a detection surface 32a of the photodiode 32 is arranged so as to face upward. Furthermore, light L1 with a width of about 30° on one side is emitted from an upper portion of the emitting surface 31a of the laser diode 31. The light L1 is light that is emitted from the light emitting device to the outside.

Moreover, weak light L2 with a width of about 30° on one side is emitted from an upper portion of a surface opposite to the emitting surface 31a of the laser diode 31. The amount of the light L2 varies depending on the amount of the light L1.

Herein, in the embodiments, as illustrated in FIG. 6C, by setting the height of the second base 11B to be lower than the first base 11A, it is possible to detect the light L2 using the detection surface 32a in the upper part even when the photodiode 32 that has a height greater than that of the laser diode 31 is used.

Thereby, it is possible to detect the light L2 coming from the laser diode 31 by using the detection surface 32a of the photodiode 32, and feeds a detection result back to a controller of the laser diode 31. Therefore, according to the embodiments, it is possible to perform feedback control on the amount of the light L1 that is emitted from the laser diode 31.

Figure 6D:
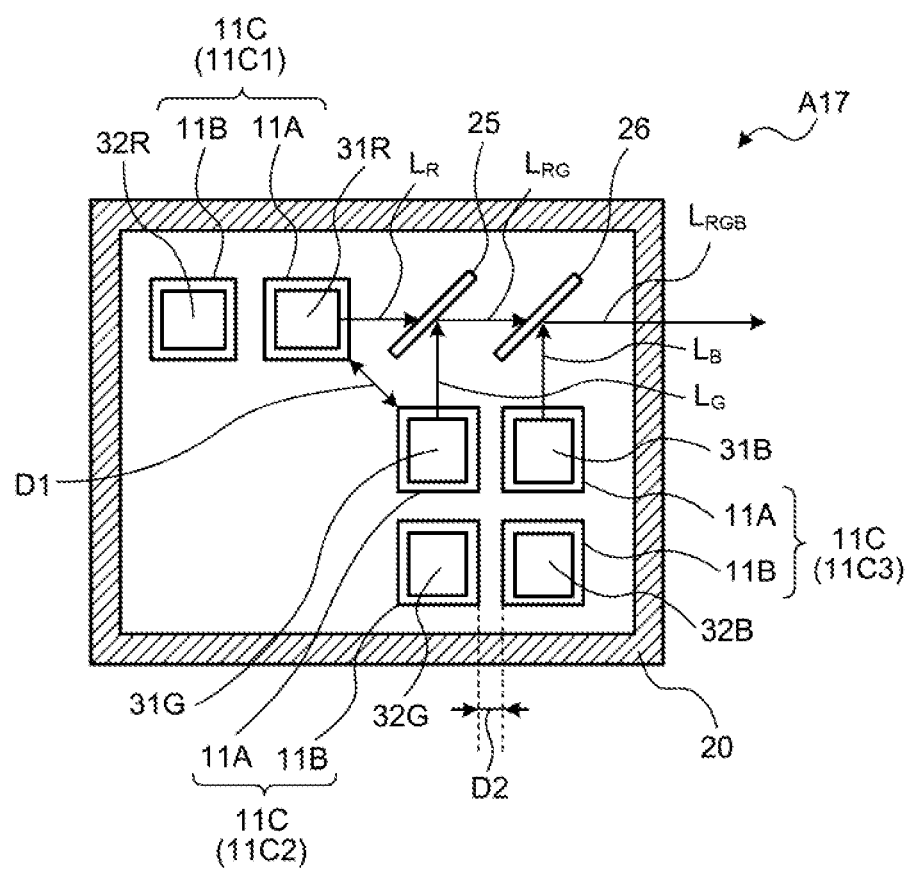
FIG. 6D is an enlarged top view of an electrical element mounting package according to a fifteenth variation of the embodiments.

A light emitting element mounting package A17 illustrated in FIG. 6D is a variation of the light emitting element mounting package A16 illustrated in FIG. 6B and FIG. 6C. In the light emitting element mounting package A17, three sets of the composite bases 11C are provided in the inner region of the sealing metal film 20. Further, optical elements 25 and 26 having functions of combining incident light and emitting combined light in a predetermined direction are provided in the inner region of the sealing metal film 20.

The optical elements 25 and 26 as described above are arranged side by side in the light irradiation direction (rightward direction in the figure), and the optical element 26 is arranged on the light irradiation direction side relative to the optical element 25.

Further, the three sets of the composite bases 11C include a red composite base 11C1 for mounting a red laser diode 31R, a green composite base 11C2 for mounting a green laser diode 31G, and a blue composite base 11C3 for mounting a blue laser diode 31B.

The first base 11A and the second base 11B of the red composite base 11C1 are arranged side by side in the light irradiation direction so as to face the optical element 25. Further, the red laser diode 31R and a photodiode 32R for detecting red laser are respectively mounted on the first base 11A and the second base 11B of the red composite base 11C1.

The first base 11A and the second base 11B of the green composite base 11C2 are arranged side by side in a direction perpendicular to the light irradiation direction so as to face the optical element 25. Further, the green laser diode 31G and a photodiode 32G for detecting green laser are respectively mounted on the first base 11A and the second base 11B of the green composite base 11C2.

The first base 11A and the second base 11B of the blue composite base 11C3 are arranged side by side in the direction perpendicular to the light irradiation direction so as to face the optical element 26. Further, the blue laser diode 31B and a photodiode 32B for detecting blue laser are respectively mounted on the first base 11A and the second base 11B of the blue composite base 11C3.

In the embodiments configured as described above, red light $L_R$ coming from the red laser diode 31R is applied to the optical element 25, and green light $L_G$ coming from the green laser diode 31G is applied to the optical element 25. Then, the optical element 25 combines the light $L_R$ and the light $L_G$, and emits combined light $L_{RG}$ to the optical element 26.

Further, blue light $L_B$ coming from the blue laser diode 31B is applied to the optical element 26, and the optical element 26 combines the light $L_{RG}$ and the light $L_B$. Then, the optical element 26 emits combined light $L_{RGB}$ in the light irradiation direction.

In other words, according to the embodiments, by providing the three sets of the composite bases 11C in the inner region of the sealing metal film 20, it is possible to combine the red light $L_R$, the green light $L_G$, and the blue light $L_B$, and emits the combined light to the outside. Therefore, it is possible to realize an optical device that may be used as a light source for a display device.

Furthermore, in the embodiments, the photodiode 32R for detecting red laser, the photodiode 32G for detecting green laser, and the photodiode 32B for detecting blue laser are mounted on the corresponding second bases 11B. Thereby, it is possible to perform feedback control on each of the amount of light $L_R$ that comes from the red laser diode 31R, the amount of light $L_G$ that comes from the green laser diode 31G, and the amount of light $L_B$ that comes from the blue laser diode 31B. Therefore, it is possible to emit the light $L_{RGB}$ that is adjusted and has high quality.

Moreover, in the embodiments, an interval D1 that is a smaller one of an interval between the red composite base 11C1 and the green composite base 11C2 and an interval between the red composite base 11C1 and the blue composite base 11C3 is greater than an interval D2 between the green composite base 11C2 and the blue composite base 11C3.

Thereby, it is possible to arrange the red laser diode 31R, which is likely to be influenced by heat from other elements, at a position away from the green laser diode 31G and the blue laser diode 31B. Therefore, it is possible to stably emit the light $L_R$ from the red laser diode 31R.

Furthermore, in the embodiments, the direction of the light $L_R$ emitted from the red laser diode 31R, the direction of the light $L_G$ emitted from the green laser diode 31G, and the direction of the light $L_B$ emitted from the blue laser diode 31B are oriented in directions in which the light does not hit the three sets of the composite bases 11C. Thereby, it is possible to realize an RGB integrated module with a small size and high quality.

Meanwhile, it is sufficient to set the size of each of the light emitting element mounting packages A1 to A17 as described above such that the width and the length are about 2 to 5 mm and the height is about 0.2 to 1 mm.

Further, in the light emitting element mounting packages A1 to A17 as described above, the element terminal 12a is mounted on the mounting surface 11a of the base 11 and the element terminal 12b is arranged at a position away from the base 11 (i.e., the mounting surface 11a).

Figure 7A:
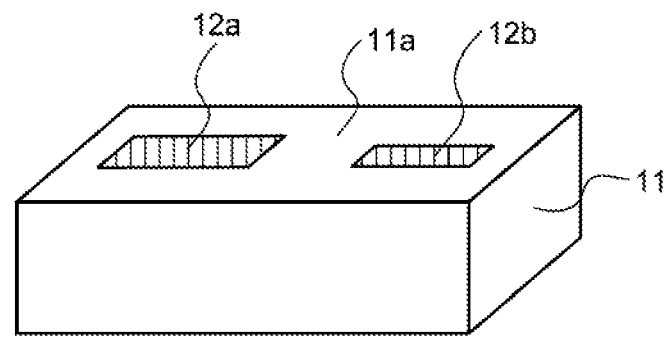
FIG. 7A is a perspective view of a base according to a sixteenth variation of the embodiments.

However, in the light emitting element mounting packages A1 to A17 of the embodiments, the configuration is not limited to the above-described example. As illustrated in FIG. 7A, the element terminal 12a and the element terminal 12b may be arranged on the mounting surface 11a of the base 11 so as to be separated from each other by a predetermined interval. In this case, the element terminal 12a and the element terminal 12b are insulated from each other on the mounting surface 11a of the base 11 by ceramics contained in the base 11.

When the element terminal 12a and the element terminal 12b are arranged at close positions on the base 11 as described above, it is possible to reduce a length of connecting wire for connecting the light emitting element 30 to the element terminals 12a and 12b (in particular, to the element terminal 12b).

Therefore, according to the example illustrated in FIG. 7A, it is possible to further reduce the sizes of the light emitting element mounting packages A1 to A17. Further, according to the example illustrated in FIG. 7A, it is possible to reduce inductance that is caused by input and output electrical currents.

Furthermore, in the light emitting element mounting packages A1 to A17 as described above, as illustrated in FIG. 7B, the element terminal 12a and the element terminal 12b may be formed in a three-dimensional manner with predetermined heights on the mounting surface 11a of the base 11.

Figure 7B:
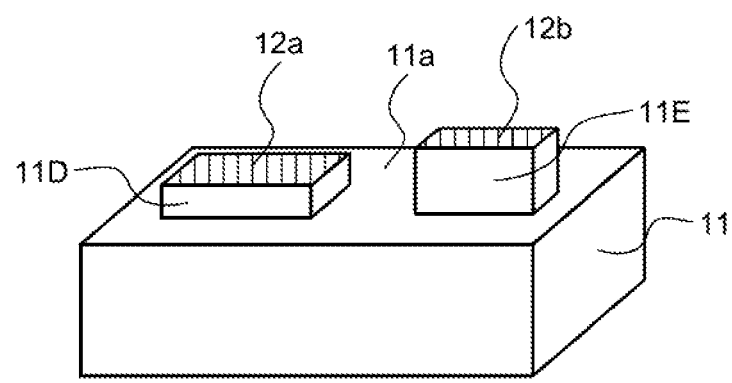
FIG. 7B is a perspective view of a base according to a seventeenth variation of the embodiments.

To form the element terminals 12a and 12b in a three-dimensional manner as described above, it may be possible to integrally provide, on the mounting surface 11a, small bases 11D and 11E that correspond to the respective areas of the element terminals 12a and 12b, by using the same material as the base 11 as illustrated in FIG. 7B, for example.

The element terminal 12a and the element terminal 12b are located at higher positions than the other region of the mounting surface 11a on the mounting surface 11a of the base 11. In other words, regions corresponding to the element terminal 12a and the element terminal 12b are convex portions, and the other region is a concave portion.

Thus, with a configuration in which the element terminal 12a and the element terminal 12b are formed in a three-dimensional manner with predetermined heights on the mounting surface 11a of the base 11, it is possible to provide the light emitting element 30 in a floating manner above the mounting surface 11a.

Thereby, it is possible to prevent light emitted from the light emitting element 30 from being reflected from and absorbed by the mounting surface 11a. Therefore, according to the example illustrated in FIG. 7B, it is possible to stably emit light from the light emitting element 30.

Figure 7C:
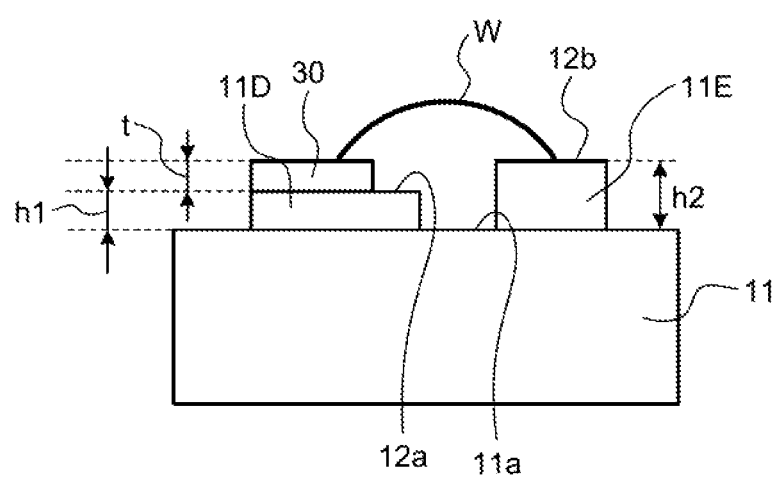
FIG. 7C is a side view of the base according to the seventeenth variation of the embodiments.

Further, in the example illustrated in FIG. 7B, as for the element terminal 12a and the element terminal 12b, as illustrated in FIG. 7C, it is preferable that a height h2 of the element terminal 12b with respect to the mounting surface 11a is greater than a height h1 of the element terminal 12a with respect to the mounting surface 11a. Furthermore, it is preferable that the height h2 of the element terminal 12b is greater than the height h1 of the element terminal 12a by an amount corresponding to a thickness t of the light emitting element 30.

Thereby, as illustrated in FIG. 7C, it is possible to reduce a length of connecting wire W for connecting the light emitting element 30 and the element terminal 12b. Therefore, according to the example illustrated in FIG. 7C, it is possible to reduce inductance that is caused by input and output electrical currents.

Figure 7D:
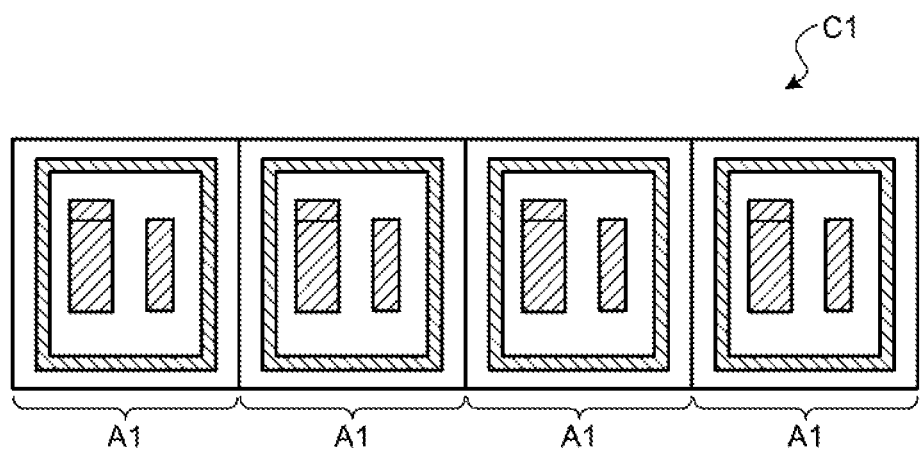
FIG. 7D is a plan view illustrating an array package according to the embodiments.

FIG. 7D is a plan view illustrating an array package C1 according to the embodiments. The array package C1 illustrated in FIG. 7D is obtained by connecting the plurality of light emitting element mounting packages A1 among the light emitting element mounting packages as described above.

<Method of Manufacturing Light Emitting Element Mounting Packages>

Next, a method of manufacturing the light emitting element mounting packages according to the embodiments will be described.

First of all, a method of manufacturing the light emitting element mounting package A1 according to the first embodiment will be described with reference to FIG. 8 and FIG. 9. FIG. 8 is a plan view of each of processes performed in a first half stage, as viewed from above (FIG. 8(d) is viewed from below), and FIG. 9 is a cross-sectional view of each of processes performed in a second half stage, as viewed from side.

As illustrated in FIG. 8(a), a green sheet 50, which has preliminarily been processed into a predetermined shape, is prepared. Subsequently, predetermined two portions in the green sheet 50 are punched into circular shapes in a plan view, and via conductors 51a and 51b are embedded in the punched two holes (FIG. 8(b)).

Then, a conductor pattern 52a is printed on an upper surface of the green sheet 50 so as to be connected to the via conductor 51a, and a conductor pattern 52b is printed so as to be connected to the via conductor 51b. Simultaneously, a frame-shaped conductor pattern 52c is printed so as to surround the conductor patterns 52a and 52b (FIG. 8(c)).

Subsequently, a conductor pattern 53a is printed on a lower surface of the green sheet 50 so as to be connected to the via conductor 51a, and a conductor pattern 53b is printed so as to be connected to the via conductor 51b (FIG. 8(d)).

FIG. 9, which illustrates the subsequent processes, is a cross-sectional view taken along the direction of arrow E-E in FIG. 8(d). The green sheet 50 is pressed from the upper side to the lower side using a press mold 100 that has a predetermined shape as illustrated in FIG. 9(a), so that a convex portion 54 is formed (FIG. 9(b)).

Simultaneously, the conductor pattern 52a (see FIG. 9(a)) is deformed such that a conductor pattern 52a1 is formed on an upper surface of the convex portion 54, a conductor pattern 52a2 is formed on a side surface of the convex portion 54, and a conductor pattern 52a3 is formed adjacent to the convex portion 54.

Herein, the convex portion 54 is a portion that corresponds to the base 11 of the light emitting element mounting package A1 (see FIG. 1B), and the conductor patterns 52a1, 52a2, and 52a3 are portions that correspond to the element terminal 12a (see FIG. 1B), the side conductor 13 (see FIG. 1B), and the flat conductor 14 (see FIG. 1B), respectively.

Furthermore, the via conductor 51a is a portion that corresponds to the substrate-side via conductor 15a of the light emitting element mounting package A1 (see FIG. 1B), the conductor pattern 53a is a portion that corresponds to the power supply terminal 16a (see FIG. 1B), and the conductor pattern 52c is a portion that corresponds to the sealing metal film 20 (see FIG. 1B).

Figure 1C:
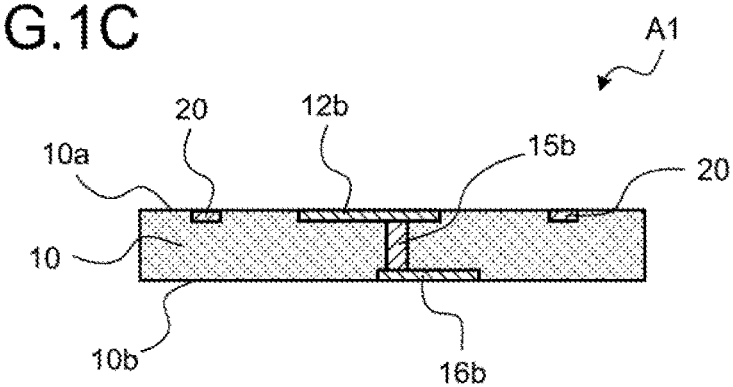
FIG. 1C is a cross-sectional view taken along the direction of arrow B-B in FIG. 1B.

Moreover, although not illustrated in FIG. 9(b), in the green sheet 50, the via conductor 51b (see FIG. 8(b)) is a portion that corresponds to the substrate-side via conductor 15b of the light emitting element mounting package A1 (see FIG. 1C).

Furthermore, the conductor pattern 52b (see FIG. 8(c)) is a portion that corresponds to the element terminal 12b of the light emitting element mounting package A1 (see FIG. 1C), and the conductor pattern 53b (see FIG. 8(d)) is a portion that corresponds to the power supply terminal 16b (see FIG. 1C).

Then, at the end of the manufacturing process, the green sheet 50 formed as illustrated in FIG. 9(b) is fired at high temperature (about 1800° C.), so that the light emitting element mounting package A1 is completed.

The green sheet 50 used in the manufacturing process as described above is, as a basic configuration, inorganic powder that is obtained by, for example, mixing aluminum nitride powder as main raw material with powder that is made of yttria ($Y_2O_3$), calcia (CaO), erbia ($Er_2O_3$), or the like as sintering agent. Further, the green sheet 50 is formed by adding and mixing organic binder, fluxing material, and solvent to the inorganic powder in a slurry manner, and applying a conventional known doctor blade method or calendar roll method thereto.

Further, the conductor patterns 52a, 52b, 52c, 53a, and 53b and the via conductors 51a and 51b are formed as paste by mixing, for example, tungsten (w) as main raw material with aluminum nitride, organic binder, fluxing material, and the like as additives.

Figure 10:
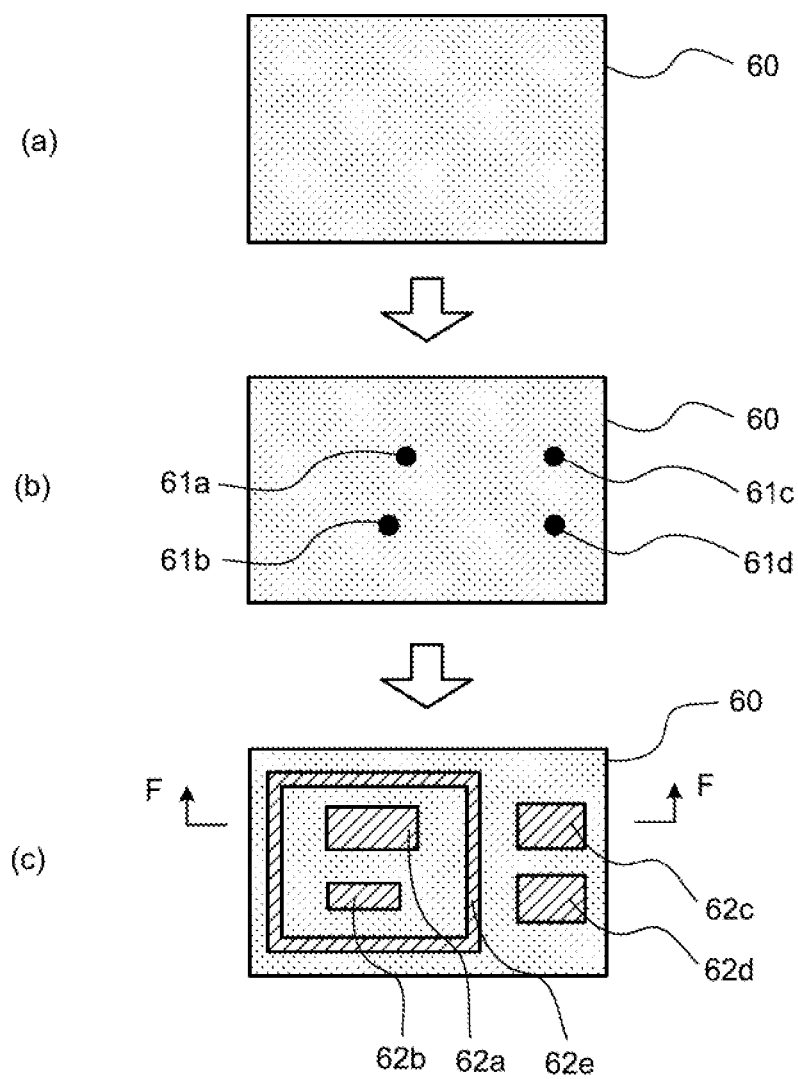
FIG. 10 is a plan view illustrating one manufacturing process of the electrical element mounting package according to the second embodiment.
Figure 11:
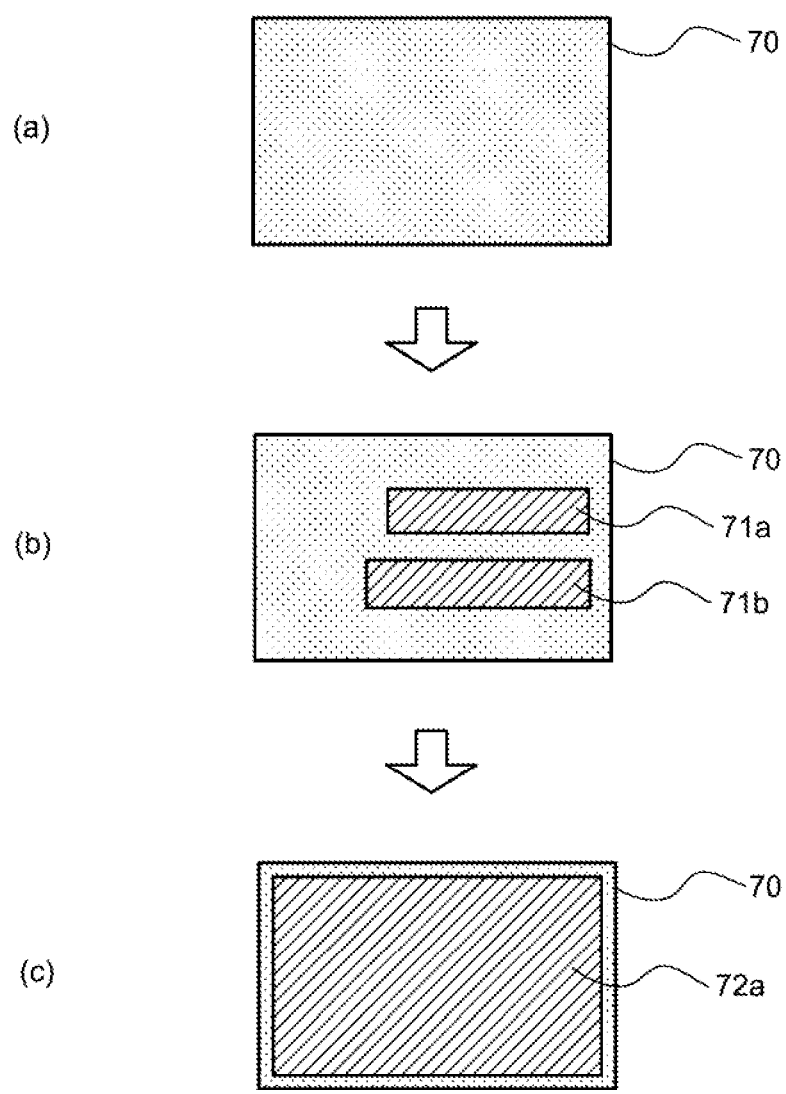
FIG. 11 is a plan view illustrating another manufacturing process of the electrical element mounting package according to the second embodiment.

Next, a method of manufacturing the light emitting element mounting package A2 according to the second embodiment will be described with reference to FIG. 10 to FIG. 12.

The light emitting element mounting package A2 is formed by first performing a predetermined process on each of two green sheets, laminating the two green sheets, and firing such a laminate.

In the following, each of processes performed in a first half stage on a green sheet 60 that is an upper sheet of the two green sheets will be described based on FIG. 10 that is a plan view of the processes, and each of processes performed in the first half stage on a green sheet 70 that is a lower sheet will be described based on FIG. 11 that is a plan view of the processes. Each of processes performed in a second half stage on the green sheets 60 and 70 will be described lastly based on FIG. 12 that is a cross-sectional view of the processes.

As illustrated in FIG. 10(a), the green sheet 60, which has preliminarily been processed into a predetermined shape, is prepared. Subsequently, predetermined four portions in the green sheet 60 are punched into circular shapes in a plan view, and via conductors 61a, 61b, 61c, and 61d are embedded in the punched four holes (FIG. 10(b)).

Then, a conductor pattern 62a is printed on the green sheet 60 so as to be connected to the via conductor 61a, and a conductor pattern 62b is printed so as to be connected to the via conductor 61b. Simultaneously, a frame-shaped conductor pattern 62e is printed so as to surround the conductor patterns 62a and 62b. Simultaneously, a conductor pattern 62c is printed so as to be connected to the via conductor 61c, and a conductor pattern 62d is printed so as to be connected to the via conductor 61d (FIG. 10(c)).

Further, as illustrated in FIG. 11(a), the green sheet 70, which has preliminarily been processed into a predetermined shape, is prepared. Subsequently, conductor patterns 71a and 71b are printed on an upper surface of the green sheet 70 (FIG. 11(b)). Meanwhile, the conductor pattern 71a is provided at a position corresponding to the via conductors 61a and 61c that are provided on the green sheet 60, and the conductor pattern 71b is provided at a position corresponding to the via conductors 61b and 61d that are provided on the green sheet 60.

Then, a conductor pattern 72a is printed so as to cover a lower surface of the green sheet 70 (FIG. 11(c)).

Figure 12:
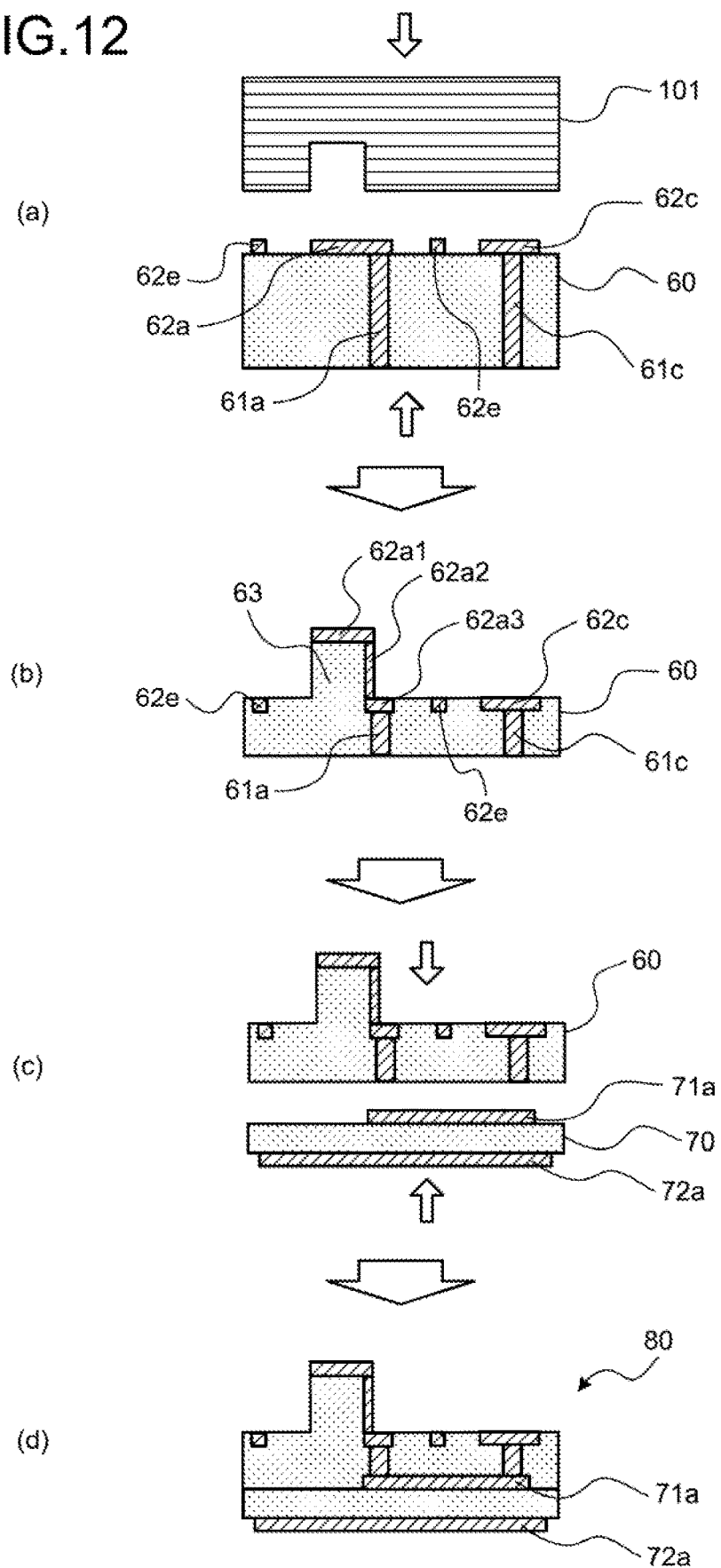
FIG. 12 is a cross-sectional view illustrating another manufacturing process of the electrical element mounting package according to the second embodiment.

FIG. 12, which illustrates the subsequent processes, is a cross-sectional view taken along the direction of arrow F-F in FIG. 10(c). The green sheet 60 is pressed from the upper side to the lower side using a press mold 101 that has a predetermined shape as illustrated in FIG. 12(a), so that a convex portion 63 is formed (FIG. 12(b)).

Simultaneously, the conductor pattern 62a (see FIG. 12(a)) is deformed such that a conductor pattern 62a1 is formed on an upper surface of the convex portion 63, a conductor pattern 62a2 is formed on a side surface of the convex portion 63, and a conductor pattern 62a3 is formed adjacent to the convex portion 63.

Herein, the convex portion 63 is a portion that corresponds to the base 11 of the light emitting element mounting package A2 (see FIG. 2B), and the conductor patterns 62a1, 62a2, and 62a3 are portions that correspond to the element terminal 12a (see FIG. 2B), the side conductor 13 (see FIG. 2B), and the flat conductor 14 (see FIG. 2B), respectively.

Further, the via conductors 61a and 61c are portions that correspond to the substrate-side via conductor 15a (see FIG. 2B) and the element-side via conductor 18a (see FIG. 2B) of the light emitting element mounting package A2, respectively. Furthermore, the conductor patterns 62c and 62e are portions that correspond to the power supply terminal 16a (see FIG. 2B) and the sealing metal film 20 (see FIG. 2B) of the light emitting element mounting package A2, respectively.

Subsequently, as illustrated in FIG. 12(c), a laminate molded body 80 is formed by arranging the green sheet 70 under the green sheet 60 that has been pressed and applying heat and pressure thereto (FIG. 12(d)).

Herein, the conductor pattern 71a is a portion that corresponds to the wiring conductor 17a (see FIG. 2B) of the light emitting element mounting package A2, and the conductor pattern 72a is a portion that corresponds to the metal film 21 (see FIG. 2B).

Further, although not illustrated in FIG. 12(d), in the laminate molded body 80, the via conductors 61b and 61d (see FIG. 10(b)) are portions that correspond to the substrate-side via conductor 15b (see FIG. 2C) and the element-side via conductor 18b (see FIG. 2C) of the light emitting element mounting package A2, respectively.

Furthermore, the conductor patterns 62b and 62d (see FIG. 10(c)) are portions that correspond to the element terminal 12b (see FIG. 2C) and the power supply terminal 16b (see FIG. 2C) of the light emitting element mounting package A2, respectively, and the conductor pattern 71b (see FIG. 11(b)) is a portion that corresponds to the wiring conductor 17b (see FIG. 2C).

Then, at the end of the manufacturing process, the laminate molded body 80 formed as illustrated in FIG. 12(d) is fired at high temperature (about 1800° C.), so that the light emitting element mounting package A2 is completed.

Next, a method of manufacturing the light emitting element mounting package A3 according to the variation illustrated in FIG. 3A will be described with reference to FIG. 13. The method of manufacturing the light emitting element mounting package A3 is basically the same as the method of manufacturing the light emitting element mounting package A1 as illustrated in FIG. 8 and FIG. 9, and therefore, different processes will be mainly described.

As illustrated in FIG. 13(a), the green sheet 50, in which a plurality of conductor patterns and via conductors are formed, is pressed from the upper side to the lower side of the green sheet 50 using a press mold 102 that has a predetermined shape (FIG. 13(b)), so that the convex portion 54 is formed.

Herein, the conductor pattern 52a that is provided on the upper surface of the green sheet 50 is printed so as to be arranged on only an upper surface of the convex portion 54, and the via conductor 51a that penetrates through the green sheet 50 is provided so as to be located inside the convex portion 54.

Thereby, the conductor pattern 52a is a portion that corresponds to the element terminal 12a (see FIG. 3A) of the light emitting element mounting package A3, and the via conductor 51a is a portion that corresponds to the base-side via conductor 19 (see FIG. 3A) and the substrate-side via conductor 15a (see FIG. 3A). Therefore, it is possible to form the light emitting element mounting package A3 in which the base-side via conductor 19 is provided.

Next, a method of manufacturing the light emitting element mounting package A5 illustrated in FIG. 3C will be described with reference to FIG. 14. The method of manufacturing the light emitting element mounting package A5 is basically the same as the method of manufacturing the light emitting element mounting package A2 as illustrated in FIG. 10 to FIG. 12, and therefore, different processes will be mainly described.

The green sheet 60, in which a plurality of conductor patterns and via conductors are formed, is pressed from the upper side to the lower side of the green sheet 60 using a press mold 103 that has a predetermined shape (FIG. 14(a)).

Herein, a convex portion 103a is provided on the press mold 103 at a position corresponding to the conductor pattern 62e, so that a groove 64 is formed on a front surface of the green sheet 60 by the convex portion 103a, and the conductor pattern 62e is arranged inside the groove 64 (FIG. 14(b)).

Herein, the groove 64 is a portion that corresponds to the groove 10c of the light emitting element mounting package A5 (see FIG. 3C), and the conductor pattern 62e is a portion that corresponds to the sealing metal film 20 (see FIG. 3C). Thereby, it is possible to form the light emitting element mounting package A5 in which the groove 10c is provided on the front surface 10a of the substrate 10 and the sealing metal film 20 is provided inside the groove 10c.

EXAMPLES

In the following description, the light emitting element mounting packages A1 to A6 according to the embodiments and variations were specifically manufactured, and light emitting devices to which the light emitting element mounting packages A1 to A6 were applied were manufactured.

First of all, as mixed powder for forming green sheets, mixed powder was prepared by mixing 5% by mass of yttria powder and 1% by mass of calcia powder with 94% by mass of aluminum nitride powder.

Subsequently, slurry was prepared by adding 20 parts by mass of acrylic binder as organic binder and 50 parts by mass of toluene to 100 parts by mass of the mixed powder (solid content), and then a green sheet with a predetermined thickness was manufactured by using a doctor blade method.

Further, to form conductors, such as the conductor patterns and the via conductors, conductor pastes were used, which were obtained by adding 20 parts by mass of aluminum nitride powder, 8 parts by mass of acrylic binder, and an appropriate amount of terpineol to 100 parts by mass of tungsten powder.

Then, the green sheet 50 (see FIG. 9(b) and FIG. 13(b)) and the laminate molded body 80 (see FIG. 12(d)) were manufactured using the green sheet and the conductors containing the above-described components, through the manufacturing methods as illustrated in FIG. 8 to FIG. 14.

Subsequently, the light emitting element mounting packages A1 to A6 were manufactured by firing, in the reducing atmosphere, the green sheet 50 and the laminate molded body 80 manufactured as above for two hours under a condition in which the maximum temperature was 1800° C. The manufactured light emitting element mounting packages A1 to A6 had sizes such that, in the shapes after the firing, width of 2.5 mm×length of 4.2 mm×height of 0.6 mm, and the mounting surface 11a had a size such that width of 0.5 mm×length of 0.5 mm.

Subsequently, on the light emitting element mounting packages A1 to A6, Ni coated films with thicknesses of about 5 µm were formed and Au coated films with thicknesses of about 0.1 µm were further formed.

Then, the light emitting elements 30 were mounted on the mounting surfaces 11a of the light emitting element mounting packages A1 to A6. Herein, Au—Sn solder (melting point: 280° C.) was used to bond the light emitting elements 30 to the mounting surfaces 11a.

Subsequently, the cap 40 made of Kovar was bonded to the sealing metal film 20. For this bonding, Ag—Sn solder (melting point: 221° C.) was used and the atmosphere inside the cap 40 was replaced with He gas. Further, a glass plate that had a predetermined size and was coated with an antireflection film was bonded to the side window 41 of the cap 40 by low-melting-point glass paste at about 430° C.

Thus, the light emitting devices, to which the light emitting element mounting packages A1 to A6 according to the embodiments were applied, were manufactured. Further, as a comparative example, a light emitting device using a light emitting element mounting package, to which a conventional metal base was applied, was manufactured.

Subsequently, thermal resistance of each of the manufactured light emitting devices was evaluated. Herein, the number of samples for each structure was set such that n=5, and a difference between the temperature of the mounting surface 11a of the base 11 and the temperature of the back surface 10b of the substrate 10 was evaluated. In other words, a larger value of the temperature difference indicated lower thermal resistance and higher heat dissipation performance.

Further, as for the evaluation of the thermal resistance of each of the light emitting devices, evaluation was performed for each of a case in which a heat dissipation member was not bonded to the back surface 10b of the substrate 10 and a case in which a heat dissipation member was bonded to the back surface 10b. The size of the heat dissipation member to be bonded was set such that the heat dissipation member could be attached to the entire back surface 10b of the substrate 10 (e.g., width of 2 mm×length of 3 mm×thickness of 2 mm), with respect to the samples in which the power supply terminals 16a and 16b were provided on the front surface 10a of the substrate 10.

In contrast, with respect to the samples in which the power supply terminals 16a and 16b were provided on the back surface 10b of the substrate 10, the size of the heat dissipation member was set such that portions corresponding to the power supply terminals 16a and 16b were excluded.

In addition to the evaluation of the thermal resistance, leakage property of He gas inside the cap 40 was evaluated. Specifically, the manufactured light emitting devices were set in a vacuum container, and times of detection of He gas were measured using gas chromatography. Further, values of evaluation results were relative times under the condition that the time at which He was first detected in sample 1, in which the light emitting element mounting package A1 was adopted, was assumed as 1.0.

Evaluation results of the thermal resistance and evaluation results of the leakage property of He gas in each of the structures were illustrated in Table 1.

TABLE 1

| Sample Number | Position of Power Supply Terminal | Shape of Conductor on Base | Presence/Absence of Groove for Seal Ring Member | Thermal Resistance (° C.) | (° C.) | He Leakage Test# (a. u.) |
|---|---|---|---|---|---|---|
| 1 | BACK SURFACE | SIDE CONDUCTOR | ABSENT | 40 | 45 | 1.0 |
| 2 | FRONT SURFACE | SIDE CONDUCTOR | ABSENT | 35 | 48 | 1.0 |
| 3 | BACK SURFACE | VIA CONDUCTOR | ABSENT | 50 | 54 | 0.9 |
| 4 | FRONT SURFACE | VIA CONDUCTOR | ABSENT | 45 | 58 | 0.9 |
| 5 | FRONT SURFACE | SIDE CONDUCTOR | PRESENT | 38 | 51 | 0.95 |
| 6 | FRONT SURFACE | VIA CONDUCTOR | PRESENT | 47 | 60 | 0.95 |
| *7 | METAL BASE | | | 20 | 43 | 0.9 |

\* indicates a sample that is out of range of the present invention
indicates relative times under the condition that the time at which He was first detected in sample 1 was assumed as 1.0

By comparison between sample 7 in which a conventional metal base was adopted and samples 1 to 6 in which the light emitting element mounting packages A1 to A6 according to the embodiments were adopted, it can be seen that the light emitting element mounting packages A1 to A6 according to the embodiments have excellent heat dissipation performance.

Further, by comparison between samples 1, 2, and 5 in which the side conductor 13 is provided on the base 11 and samples 3, 4, and 6 in which the base-side via conductor 19 is provided on the base 11, it can be seen that the heat dissipation performance is further improved by providing the base-side via conductor 19 on the base 11.

Meanwhile, samples to which the light emitting element mounting packages A7 to A17 were adopted were manufactured in the same manner and evaluation was performed. The thermal resistance of these samples was in a range of ±1° C. with respect to each of the values of sample 6, both in the case in which the heat dissipation member was not provided and the case in which the heat dissipation member was provided. Further, results of the He leakage test were within a range of 0.95±0.01.

While the embodiments of the present invention have been described above, the present invention is not limited to the embodiments as described above, but various modifications may be made without departing from the gist of the present invention. For example, while airtight sealing of the light emitting element 30 or the like is realized by using the cap 40 or the like in the embodiments as described above, a member that realizes the airtight sealing is not limited to the cap 40. For example, it may be possible to realize airtight sealing of the light emitting element or the like by combining a frame-shaped seal ring (sealing member) in which a side window is provided at a predetermined position and a plate-shaped cap.

As described above, the electrical element mounting package according to the embodiments (the light emitting element mounting packages A1 to A17) includes the plate-like substrate 10, and at least one base 11 that protrudes from the front surface 10a of the substrate 10 and has the mounting surface 11a on which an electrical element (the light emitting element 30, the laser diode 31, the red laser diode 31R, the green laser diode 31G, and the blue laser diode 31B) is mounted, where the substrate 10 and the base 11 are made of ceramics integrally. Thereby, it is possible to realize the electrical element mounting package with high heat dissipation performance.

Furthermore, the electrical element mounting package according to the embodiments (the light emitting element mounting packages A1, A2, A5, and A7 to A17) includes the element terminal 12a that is provided on the mounting surface 11a of the base 11, the side conductor 13 that is provided on the side surface 11b of the base 11 and extends in the thickness direction of the base 11, and the substrate-side via conductor 15a that is provided inside the substrate 10 and extends in the thickness direction of the substrate 10, wherein the element terminal 12a, the side conductor 13, and the substrate-side via conductor 15a are connected to one another. Thereby, it is possible to improve the heat dissipation performance of the electrical element mounting package.

Moreover, the electrical element mounting package according to the embodiments (the light emitting element mounting packages A3, A4, and A6) includes the element terminal 12a that is provided on the mounting surface 11a of the base 11, the base-side via conductor 19 that is provided inside the base 11 and extends in the thickness direction of the base 11, and the substrate-side via conductor 15a that is provided inside the substrate 10 and extends in the thickness direction of the substrate 10, wherein the element terminal 12a, the base-side via conductor 19, and the substrate-side via conductor 15a are connected to one another. Thereby, it is possible to further improve the heat dissipation performance of the electrical element mounting package.

Furthermore, the electrical element mounting package according to the embodiments (the light emitting element mounting packages A2 and A4 to A17) includes the wiring conductor 17a that is provided inside the substrate 10 and extends in the surface direction of the substrate 10, wherein the wiring conductor 17a and the substrate-side via conductor 15a are connected to each other. Thereby, it is possible to arrange the power supply terminal 16a not only on the back surface 10b of the substrate 10 but also on the front surface 10a of the substrate 10.

Moreover, in the electrical element mounting package according to the embodiments (the light emitting element mounting packages A2 and A4 to A17), the wiring conductor 17a is provided at a position closer to the back surface 10b of the substrate 10 than the front surface 10a of the substrate 10. Thereby, it is possible to realize the electrical element mounting package with high reliability.

Furthermore, the electrical element mounting package according to the embodiments (the light emitting element mounting packages A2 and A4 to A17) includes the sealing metal film 20 that is provided on the front surface 10a side of the substrate 10 so as to surround the base 11 and the power supply terminal 16a that is provided on the outer side of the sealing metal film 20, wherein the power supply terminal 16a and the wiring conductor 17a are connected to each other. Thereby, it is possible to further improve the heat dissipation performance of the package.

Moreover, in the electrical element mounting package according to the embodiments (the light emitting element mounting packages A5 and A6), the groove 10c is provided on the front surface 10a of the substrate 10 so as to surround the base 11, and the sealing metal film 20 is provided inside the groove 10c. Thereby, it is possible to further improve the reliability of the electrical device and further improve the heat dissipation performance of the package.

Furthermore, in the electrical element mounting package according to the embodiments (the light emitting element mounting packages A9 to A12 and A14), the power supply terminals 16a and 16b are provided at positions that are lower than the front surface 10a of the substrate 10. Thereby, it is possible to easily determine the position of the FPC 200.

Moreover, in the electrical element mounting package according to the embodiments (the light emitting element mounting packages A12 and A14), outer edges of the power supply terminals 16a and 16b include the two linear edges 16c and 16d that intersect with each other, and the two edges 16c and 16d are positioned so as to respectively fit the edge of the end surface 10d and the edge of the side surface 10e of the substrate 10. Thereby, it is possible to facilitate module design of the electrical device.

Furthermore, in the electrical element mounting package according to the embodiments (the light emitting element mounting packages A13 and A14), the inner region of the sealing metal film 20 is recessed from the front surface 10a of the substrate 10 except for a portion corresponding to the base 11. Thereby, it is possible to further reduce the height of the electrical device and prevent reflection of light from the surface on the front surface 10a side.

Moreover, in the electrical element mounting package according to the embodiments (the light emitting element mounting packages A15 to A17), the plurality of bases 11 are provided in the inner region of the sealing metal film 20. Thereby, it is possible to reduce the size of the electrical device.

Furthermore, in the electrical element mounting package according to the embodiments (the light emitting element mounting packages A16 and A17), the composite base 11C including the first base 11A and the second base 11B is provided as the base 11 in the inner region of the sealing metal film 20, and the height of the second base 11B is less than the height of the first base 11A in the composite base 11C. Thereby, it is possible to perform feedback control on the amount of light L1 ($L_R$, $L_G$, $L_B$) that is emitted from the laser diode 31 (the red laser diode 31R, the green laser diode 31G, and the blue laser diode 31B).

Moreover, in the electrical element mounting package according to the embodiments (the light emitting element mounting package A17), three sets of the composite bases 11C are provided in the inner region of the sealing metal film 20. Thereby, it is possible to emit the light $L_{RGB}$ that is adjusted and has high quality, as a light source for a display device.

Furthermore, in the electrical element mounting package according to the embodiments (the light emitting element mounting package A17), the three sets of the composite bases 11C include the red composite base 11C1 that includes the first base 11A for mounting the red laser diode 31R, the green composite base 11C2 that includes the first base 11A four mounting the green laser diode 31G, and the blue composite base 11C3 that includes the first base 11A for mounting the blue laser diode 31B, and the interval D1 that is a smaller one of the interval between the red composite base 11C1 and the green composite base 11C2 and the interval between the red composite base 11C1 and the blue composite base 11C3 is greater than the interval D2 between the green composite base 11C2 and the blue composite base 11C3. Thereby, it is possible to stably emit the light $L_R$ from the red laser diode 31R.

Moreover, in the electrical element mounting package according to the embodiments (the light emitting element mounting package A17), the three sets of the composite bases 11C are arranged such that the directions of the light $L_R$, $L_G$, and $L_B$ emitted from the respective mounted laser diodes (the red laser diode 31R, the green laser diode 31G, and the blue laser diode 31B) are oriented in directions in which the light does not hit the three sets of the composite bases 11C. Thereby, it is possible to realize an RGB integrated module with a small size and high quality.

Furthermore, in the array package C1 according to the embodiments, the plurality of electrical element mounting packages (the light emitting element mounting package A1 to A17) are connected to one another. Thereby, it is possible to obtain an array electrical device.

Moreover, in the array package C1 according to the embodiments, the electrical element mounting packages (the light emitting element mounting package A1 to A17) are sintered integrally. Thereby, it is possible to obtain an array electrical device with high heat dissipation performance and high strength.

Furthermore, the electrical device according to the embodiments includes the electrical element mounting package (the light emitting element mounting package A1 to A17), and the electrical element (the light emitting element 30, the laser diode 31, the red laser diode 31R, the green laser diode 31G, and the blue laser diode 31B) that is mounted on the mounting surface 11a of the electrical element mounting package (the light emitting element mounting package A1 to A17). Thereby, it is possible to realize the electrical device with high heat dissipation performance.

Moreover, the electrical device according to the embodiments includes the electrical element mounting package (the light emitting element mounting package A1 to A17), the electrical element (the light emitting element 30, the laser diode 31, the red laser diode 31R, the green laser diode 31G, and the blue laser diode 31B) that is mounted on the mounting surface 11a of the electrical element mounting package (the light emitting element mounting package A1 to A17), and the cap 40 that is provided on the sealing metal film 20 and has the side window 41. Thereby, it is possible to realize the electrical device with high reliability.

Furthermore, the electrical device according to the embodiments includes the array package C1, and the electrical element (the light emitting element 30, the laser diode 31, the red laser diode 31R, the green laser diode 31G, and the blue laser diode 31B) that is mounted on the mounting surface 11a of the array package C1. Thereby, it is possible to obtain the array electrical device with high heat dissipation performance and high strength.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

REFERENCE SIGNS LIST

A1 to A17 LIGHT EMITTING ELEMENT MOUNTING PACKAGE
C1 ARRAY PACKAGE
10 SUBSTRATE
10a FRONT SURFACE
10b BACK SURFACE
10c GROOVE
10d END SURFACE
10e SIDE SURFACE
10f, 10g CONCAVE PORTION
11 BASE
11a MOUNTING SURFACE
11b SIDE SURFACE
11A FIRST BASE
11B SECOND BASE
11C COMPOSITE BASE
11C1 RED COMPOSITE BASE
11C2 GREEN COMPOSITE BASE
11C3 BLUE COMPOSITE BASE
12a, 12b ELEMENT TERMINAL
13 SIDE CONDUCTOR
14 FLAT CONDUCTOR
15a, 15b SUBSTRATE-SIDE VIA CONDUCTOR
16a, 16b POWER SUPPLY TERMINAL
16c, 16d EDGE
17a, 17b WIRING CONDUCTOR
18a, 18b ELEMENT-SIDE VIA CONDUCTOR
19 BASE-SIDE VIA CONDUCTOR
20 SEALING METAL FILM
21 METAL FILM
30 LIGHT EMITTING ELEMENT
30a EMITTING SURFACE
31 LASER DIODE
31R RED LASER DIODE
31G GREEN LASER DIODE
31B BLUE LASER DIODE
32, 32R, 32G, 32B PHOTODIODE
40 CAP
41 SIDE WINDOW

The invention claimed is:
1. A light emitting element mounting package comprising:
a substrate that is plate-like;
a base that protrudes from a front surface of the substrate and that has a mounting surface on which a light emitting element is mounted;
a first power supply terminal and a second power supply terminal that are provided on the front surface of the substrate, wherein the first power supply terminal and the second power supply terminal are arranged in a direction that is opposite to a direction where an emitting surface of the light emitting element is oriented, and the first power supply terminal and the second power supply terminal are positioned on an opposite side of the emitting surface and a back side of the mounting surface;
a first wiring conductor and a second wiring conductor that extend in a surface direction of the substrate;
a first element terminal that is provided to be adjacent to the base on the front surface of the substrate; and
a second element terminal that is provided on the mounting surface of the base, wherein
the first element terminal is electrically connected to the first power supply terminal through the first wiring conductor, and
the second element terminal is electrically connected to the second power supply terminal through the second wiring conductor.

2. The light emitting element mounting package according to claim 1, wherein
the first element terminal is positioned in a transverse direction with respect to a direction where the emitting surface of the light emitting element and the first power supply terminal are aligned.

3. The light emitting element mounting package according to claim 1, wherein:
the first wiring conductor and the second wiring conductor are provided inside the substrate;
the first wiring conductor extends to a side of the first power supply terminal where one end thereof is positioned at a side of the first power supply terminal with respect to the emitting surface of the light emitting element and the other end thereof is electrically connected to the first power supply terminal; and
the second wiring conductor extends to a side of the second power supply terminal where one end thereof is positioned at a side of the second power supply terminal with respect to the emitting surface of the light emitting element and the other end thereof is electrically connected to the second power supply terminal.

4. The light emitting element mounting package according to claim 1, further comprising:
a side conductor that is provided on a side surface of the base and that extends in a thickness direction of the base; and
a substrate-side via conductor that is provided inside the substrate and that extends in a thickness direction of the substrate, wherein:
the second element terminal is electrically connected to the second power supply terminal through the side conductor, the substrate-side via conductor, and the second wiring conductor.

5. The light emitting element mounting package according to claim 1, further comprising:
- a base-side via conductor that is provided inside the base and that extends in a thickness direction of the base; and
- a substrate-side via conductor that is provided inside the substrate and that extends in a thickness direction of the substrate, wherein:
- the second element terminal is electrically connected to the second power supply terminal through the base-side via conductor, the substrate-side via conductor, and the second wiring conductor.

6. The light emitting element mounting package according to claim 1, wherein
- the first wiring conductor and the second wiring conductor are arranged to be closer to a back surface of the substrate than the front surface of the substrate.

7. The light emitting element mounting package according to claim 1, wherein
- the first power supply terminal and the second power supply terminal are provided to be lower than the front surface of the substrate.

8. The light emitting element mounting package according to claim 1, further comprising
- a sealing metal film that is provided on the front surface of the substrate to surround the base, wherein
- an inner region of the sealing metal film except for a portion of the base is recessed with respect to the front surface of the substrate.

9. The light emitting element mounting package according to claim 1, wherein
- a height of the first element terminal with respect to the mounting surface is greater than a height of the second element terminal with respect to the mounting surface.

10. An array package comprising
- a plurality of the light emitting element mounting packages according to claim 1 that are connected.

11. The array package according to claim 10, wherein
- the plurality of light emitting element mounting packages are integrated with sintering.

12. An electrical device comprising:
- the light emitting element mounting package according to claim 1; and
- a light emitting element that is mounted on the mounting surface of the light emitting element mounting package.

13. An electrical device comprising:
- the light emitting element mounting packages that are included in the array package according to claim 10; and
- light emitting elements that are mounted on the mounting surfaces of the light emitting element mounting packages.

* * * * *